US012272629B2

(12) United States Patent
Liu et al.

(10) Patent No.: US 12,272,629 B2
(45) Date of Patent: Apr. 8, 2025

(54) SEMICONDUCTOR DEVICE HAVING AN INTEGRATED DEVICE POSITIONED WITHIN A HYBRID INTERPOSER THAT INCLUDES ORGANIC AND NON-ORGANIC MATERIALS

(71) Applicant: Taiwan Semiconductor Manufacturing Company Limited, Hsinchu (TW)

(72) Inventors: Monsen Liu, Hsinchu (TW); Shuo-Mao Chen, New Taipei (TW); Po-Ying Lai, Hsinchu (TW); Shang-Lun Tsai, Hsinchu (TW); Shin-Puu Jeng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 227 days.

(21) Appl. No.: 17/462,057

(22) Filed: Aug. 31, 2021

(65) Prior Publication Data

US 2023/0063304 A1 Mar. 2, 2023

(51) Int. Cl.
*H01L 23/498* (2006.01)
*H01L 21/48* (2006.01)
*H01L 23/14* (2006.01)
*H01L 23/15* (2006.01)

(52) U.S. Cl.
CPC .... *H01L 23/49822* (2013.01); *H01L 21/4857* (2013.01); *H01L 23/145* (2013.01); *H01L 23/15* (2013.01); *H01L 23/49838* (2013.01)

(58) Field of Classification Search
CPC . H01L 23/49822; H01L 23/145; H01L 23/15; H01L 23/49838
See application file for complete search history.

(56) References Cited

U.S. PATENT DOCUMENTS

| | | | |
|---|---|---|---|
| 2014/0264811 A1* | 9/2014 | Wu | H01L 25/105 438/109 |
| 2020/0294920 A1* | 9/2020 | Hariri | H01L 23/5385 |
| 2021/0320042 A1* | 10/2021 | Oh | H01L 25/105 |
| 2022/0399294 A1* | 12/2022 | Dogiamis | H01L 24/80 |
| 2023/0034737 A1* | 2/2023 | Wang | H01L 24/24 |

* cited by examiner

Primary Examiner — Michael Jung
(74) Attorney, Agent, or Firm — The Marbury Law Group, PLLC

(57) ABSTRACT

Devices and methods of manufacture for a hybrid interposer within a semiconductor device. A semiconductor device may include a package substrate and a hybrid interposer. The hybrid interposer may include an organic interposer material layer, and a non-organic interposer material layer positioned between the organic interposer material layer and the package substrate. The semiconductor device may further include an integrated device positioned within the hybrid interposer. In one embodiment, the integrated device may be positioned within the organic interposer material layer. In another embodiment, the integrated device may be positioned within the non-organic interposer material layer. In a further embodiment, the integrated device may be positioned within the organic interposer material layer and the non-organic interposer material layer.

20 Claims, 28 Drawing Sheets

SEMICONDUCTOR DEVICE HAVING AN INTEGRATED DEVICE POSITIONED WITHIN A HYBRID INTERPOSER THAT INCLUDES ORGANIC AND NON-ORGANIC MATERIALS

BACKGROUND

Silicon interposers may be used in the formation semiconductor devices to communicate electrical signals between semiconductor dies, such as a system-on-a-chip (SoC) or memory devices, and a printed circuit board (PCB). Silicon interposers may be used to redistribute and/or fan out connections of the smaller-package semiconductor dies to larger-package PCB layout areas. A package substrate may be embedded with an integrated device that may be used in conjunction with the semiconductor dies. For example, a package substrate may be embedded with a resistor package that may be electrically connected to the semiconductor dies through wiring in the silicon interposer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
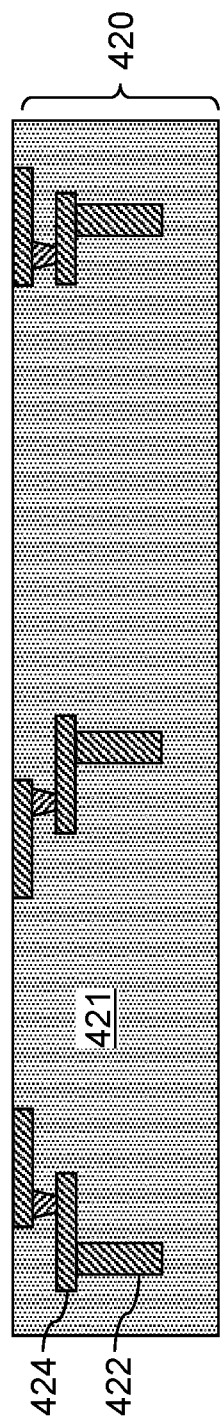
FIG. 1A is a vertical cross-sectional view of a region of the exemplary intermediate structure after a formation of non-organic interposer structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package structure containing a hybrid interposer including an integrated device and methods of forming the same.

Generally, the various embodiments disclosed herein may be used to provide a hybrid interposer that is more efficient and less susceptible to manufacturing defects than a conventional silicon interposer within a semiconductor device.

Silicon interposers may be used in the formation semiconductor devices to communicate electrical signals between semiconductor dies, such as a system-on-a-chip (SoC) or memory devices, and a printed circuit board (PCB). Silicon interposers may be used to redistribute and/or fan out connections of the smaller-package semiconductor dies to larger-package PCB layout areas. A package substrate may be embedded with an integrated device that may be used in conjunction with the semiconductor dies. For example, a package substrate may be embedded with a resistor package that may be electrically connected to the semiconductor dies through wiring in the silicon interposer. To increase semiconductor device efficiency, it may be desirable to embed integrated devices as close to the semiconductor dies as possible (e.g., within the silicon interposer), instead of embedding integrated devices within the package substrate. By placing an integrated device closer to the semiconductor dies, electrical communication pathways are physically shorter as compared to electrical communication pathways to and from an integrated device within the package substrate. By reducing physical length of electrical communication pathways between semiconductor dies and integrated devices, processing speed may increase and the chance for hardware errors/failures may be reduced.

However, difficulties may arise when embedding an integrated device within a silicon interposer. A silicon interposer may be formed using a chemical vapor deposition (CVD) process and/or a physical vapor deposition (PVD). The processing temperatures used to form a silicon interposer may be high, which may limit the type of integrated devices that may be embedded within a silicon interposer. For example, an integrated device that is susceptible to damage during a high-temperature CVD process used to form layers of a silicon interposer may not be usable within a silicon interposer. Thus, silicon interposers may be limited as to the types of integrated devices that may be embedded within them.

According to an aspect of the present disclosure, the embodiment structures and methods disclosed herein may be used to increase semiconductor device efficiency and mitigate against manufacturing defects. A hybrid interposer is provided, including non-organic interposer material layers and organic interposer material layers. A hybrid interposer may be used to provide fan-out electrical connections between semiconductor dies and a package substrate. An organic interposer material layer may be formed between a semiconductor die and a non-organic interposer material layer. A non-organic interposer material layer may be formed between the organic interposer material layer and a package substrate. Thus, a semiconductor die may communicate through wirings within the organic interposer material layer, then through wirings within the non-organic interposer material layer to the package substrate. The organic interposer material layer may have a low Young's modulus, and may act as a stress buffer between the semiconductor dies and the non-organic interposer material layers during high-stress thermal manufacturing cycles. The hybrid interposer may therefore better withstand higher temperature manufacturing cycles as compared to silicon interposers. Thus, a wider variety of integrated devices may be embedded within a hybrid interposer that may not be usable within a silicon interposer. By implementing a hybrid interposer, integrated devices may be safely embedded within the interposer during high-temperature manufacturing processes (i.e., organic interposer material layers have low thermal expansion and contraction). Thus, integrated devices may be formed within a hybrid interposer closer to semiconductor dies than integrated devices formed within package substrates, thereby reducing the electrical communication pathway and reducing processing time.

In one embodiment, an integrated device may be embedded within non-organic interposer material layers of the hybrid interposer. In an alternative embodiment, an integrated device may be embedded within organic interposer material layers of the hybrid interposer. In still another alternative embodiment, an integrated device may be embedded within non-organic interposer material layers and organic interposer material layers of the hybrid interposer. The various aspects of the methods and structures of embodiments of the present disclosure are now described with reference to the accompanying drawings.

FIG. 1A is a vertical cross-sectional view of a region of an intermediate structure after a formation of non-organic interposer structure 420 according to an embodiment of the present disclosure. Referring to FIG. 1A, a non-organic interposer structure 420 may be formed. The non-organic interposer structure 420 may include redistribution structures that may be formed on the substrate side, i.e., the side that faces semiconductor substrate to be subsequently attached. The non-organic interposer structure 420 may include non-organic interposer material layers 421, non-organic interposer wiring interconnects 424, and through-substrate via (TSV) structures 422. The non-organic interposer structure 420 may include a non-organic interposer material layer 421. More than one non-organic interposer material layer 421 may be deposited to form the non-organic interposer structure 420. For example, the non-organic interposer structure 420 may be formed in a series of steps such as by sequentially forming the non-organic interposer wiring interconnects 424 and TSV structures 422 at each of the non-organic interposer material layers 421.

The TSV structures 422 may be initially formed as via structures within the non-organic interposer material layers 421 with a vertical dimension less than the thickness of the non-organic interposer material layers 421. Subsequently, the backside of the non-organic interposer material layers 421 may be removed such that the thickness of the non-organic interposer material layers 421 after thinning is less than the thickness of the TSV structures 422, thereby providing the "through-silicon" configuration for the non-organic interposer structure 420.

An array of deep trenches having a depth greater than 20 microns may be formed within each die area of the non-organic interposer structure 420. For example, a hard mask layer (such as a silicon nitride layer and/or a borosilicate glass layer) may be formed on and/or over a front-side surface of the non-organic interposer material layers 421. A photoresist layer (not shown) may be applied over the hard mask layer. The photoresist layer may be lithographically patterned to form an array of openings therethrough, and the pattern of the openings may be transferred into the hard mask layer. An anisotropic etch that uses the hard mask (and optionally the patterned photoresist layer) as an etch mask may be performed to form the deep trenches that vertically extend from the front-side surface of the non-organic interposer structure 420 toward the backside of the non-organic interposer structure 420. The photoresist layer may be consumed during the anisotropic etch process, and the hard mask layer may be subsequently removed, for example, using a wet etch process. An array of openings, which are herein referred to as deep trenches, may vertically extend from the front-side surface of the non-organic interposer structure 420 toward the backside surface of the non-organic interposer structure 420.

The depth of the deep trenches may be in a range from 10 microns to 100 microns, such as from 20 microns to 60 microns, although lesser and greater depths may also be used. The lateral dimension of each deep trench (such as a diameter) may be in a range from 3 microns to 30 microns, such as from 6 microns to 15 microns, although lesser and greater lateral dimensions may also be used. Generally, the lateral dimension for the deep trenches may be selected to be large enough to provide deep etching into the non-organic interposer material layers 421, and may be selected to be small enough to provide filling of the deep trenches with a combination of a through-substrate insulating spacer and TSV structures 422.

At least one conductive material (such as a metallic material and/or a heavily-doped semiconductor material) may be deposited in volumes of the deep trenches. For example, the at least one conductive material may include a metallic nitride liner having a thickness in a range from 30 nm to 120 nm and a metallic fill material that includes an elemental metal or an intermetallic alloy material. In an illustrative example, the metallic nitride liner may include TiN, TaN, WN, or a combination thereof, and the metallic fill material may include W, Mo, Co, Ru, or any other transition metal or an alloy thereof. Other suitable materials are within the contemplated scope of disclosure. The at least one conductive material may be patterned, for example, by applying and patterning a photoresist layer over a horizontally-extending portion of the at least one conductive material that overlies the front-side surface of the non-organic interposer structure 420, and by transferring the pattern in the photoresist layer through the horizontally-extending portion of the at least one conductive material. In such an embodiment, remaining portions of the at least one conductive material that fill the deep trenches constitute TSV structures 422, Each of the non-organic interposer material layers 421 may include a dielectric material that is non-organic, or inorganic. For example, the non-organic interposer material layers 421 may be formed using silicon-based dielectric materials such as silicon oxide, porous or non-porous organosilicate glass, silicon carbon nitride, silicon nitride, or any other non-organic interconnect-level dielectric material. Each non-organic interposer material layers 421 may be formed by spin coating and drying of the respective non-organic dielectric material. The thickness of each non-organic interposer material layer 421 may be in a range from 2 microns to 40 microns, such as from 4 microns to 20 microns. Each non-organic interposer material layer 421 may be patterned, for example, by applying and patterning a respective photoresist layer thereabove, and by transferring the pattern in the photoresist layer into the non-organic interposer material layers 421 using an etch process such as an anisotropic etch process. The photoresist layer may be subsequently removed, for example, by ashing.

Each of the non-organic interposer wiring interconnects 424 and TSV structures 422 may be formed by depositing a metallic seed layer, by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the non-organic interposer wiring interconnects 424 may include copper, nickel, or copper and nickel. The thickness of the metallic fill material that is deposited for each non-organic interposer wiring interconnect 424 may be in a range from 2 microns to 40 microns, such as from 4 microns to 10 microns, although lesser or greater thicknesses may also be used. Typically, the total number of levels of wiring in the non-organic interposer structure 420 (i.e., the levels of the non-organic interposer wiring interconnects 424) may be in a range from 1 to 10, although a greater number of layers may be used.

Figure 1B:
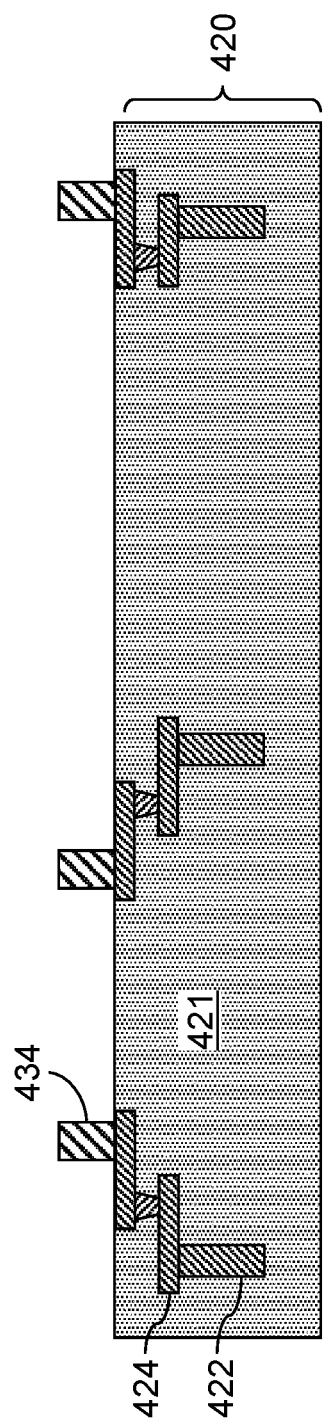
FIG. 1B is a vertical cross-sectional view of a region of the exemplary intermediate structure after a formation of interconnect bumps according to an embodiment of the present disclosure.

FIG. 1B is a vertical cross-sectional view of a region of an intermediate structure after formation of interconnect bumps 434 according to an embodiment of the present disclosure. Referring to FIG. 1B, interconnect bumps 434 may be formed over the non-organic interposer wiring interconnects 424. Interconnect bumps 434 may be formed at the topmost level of the non-organic interposer material layers 421 to be in electrical connection with the non-organic interposer wiring interconnects 424. In one embodiment, the interconnect bumps 434 may include copper pads or copper pillars that may be employed as bumps, or microbumps. The interconnect bumps 434 may be formed using a suitable deposition process that includes depositing interconnect bump material on topmost surfaces of the non-organic interposer structure 420.

The metallic fill material for the interconnect bumps 434 may include copper, although other suitable metallic conductive materials are within the contemplated scope of disclosure. The thickness of the metallic fill material that is deposited for the interconnect bumps 434 may be in a range from 5 microns to 100 microns, although lesser or greater thicknesses may also be used. The interconnect bumps 434 may have horizontal cross-sectional shapes of rectangles, rounded rectangles, or circles, although other cross-sectional shapes may be used. In embodiments in which the interconnect bumps 434 are formed as C4 (controlled collapse chip connection) pads, the thickness of the interconnect bumps 434 may be in a range from 5 microns to 50 microns, although lesser or greater thicknesses may also be used. Alternatively, the interconnect bumps 434 may be configured for bump bonding (i.e., C2 bonding), and may have a thickness in a range from 30 microns to 100 microns, although lesser or greater thicknesses may also be used. In such an embodiment, the interconnect bumps 434 may be formed as an array of microbumps (such as copper pillars) having a lateral dimension in a range from 10 microns to 25 microns, and having a pitch in a range from 20 microns to 50 microns.

Figure 1C:
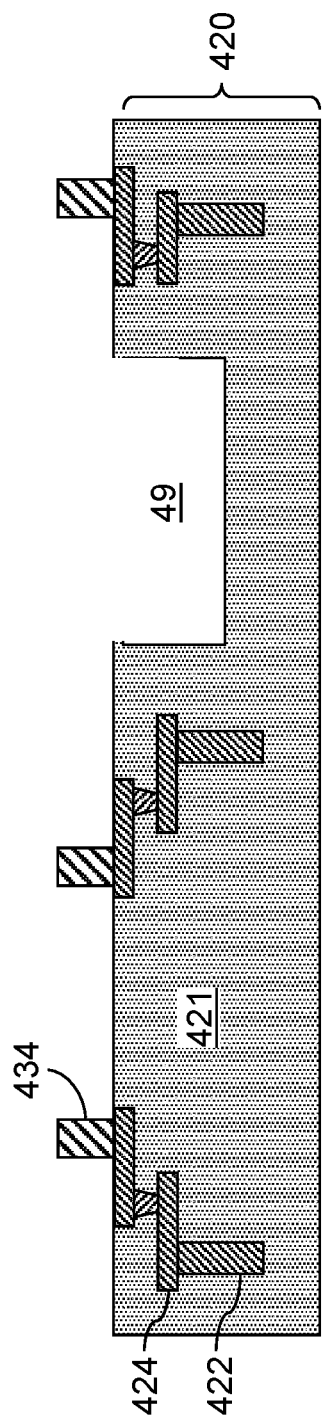
FIG. 1C is a vertical cross-sectional view of a region of the exemplary intermediate structure after etching a hybrid interposer cavity according to an embodiment of the present disclosure.

FIG. 1C is a vertical cross-sectional view of a region of the intermediate structure after etching a hybrid interposer cavity 49 according to an embodiment of the present disclosure. Referring to FIG. 1C, a hybrid interposer cavity 49 may be etched within the non-organic interposer material layers 421 of the non-organic interposer structure 420. A photoresist layer (not shown) may be applied over the top surface of the non-organic interposer material layers 421, and may be lithographically patterned and etched to form the hybrid interposer cavity 49. The pattern of the openings in the photoresist layer may be transferred through the non-organic interposer material layers 421 using an anisotropic etch process that etches the material of the non-organic interposer material layers 421 selective to the material of the interconnect bumps 434 and the non-organic interposer wiring interconnects 424. The photoresist layer may be subsequently removed, for example, by ashing. The dimensions of the hybrid interposer cavity 49 may be selected to be slightly larger than the dimensions of an integrated device to be subsequently embedded within the non-organic interposer structure 420.

Figure 1D:
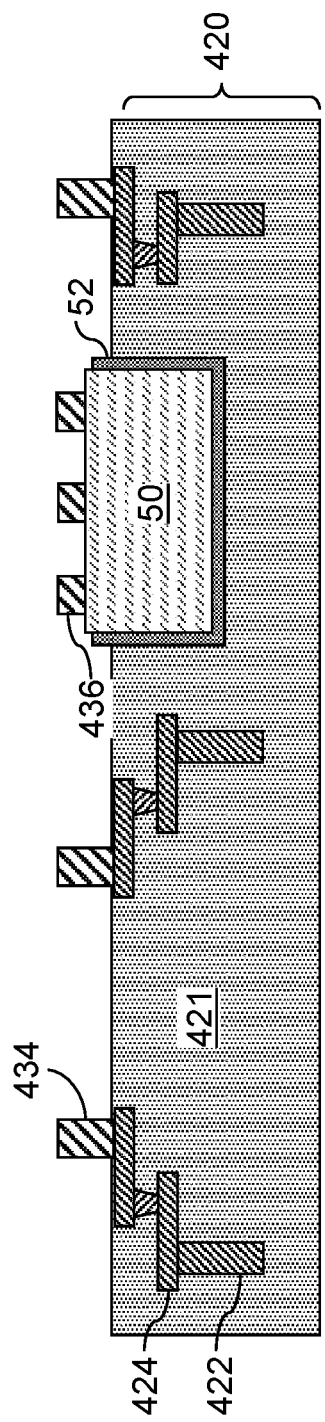
FIG. 1D is a vertical cross-sectional view of a region of the exemplary intermediate structure after forming an integrated device according to an embodiment of the present disclosure.

FIG. 1D is a vertical cross-sectional view of a region of an intermediate structure after forming an integrated device 50 according to an embodiment of the present disclosure. Referring to FIG. 1D, an integrated device 50 may be formed within the non-organic interposer structure 420. A cavity filling material 52 may be deposited in the hybrid interposer cavity 49. The cavity filling material 52 may be deposited in the hybrid interposer cavity 49 by a suitable deposition process such as a chemical vapor deposition (CVD) process. Herein, suitable deposition processes may include CVD, physical vapor deposition (PVD), atomic layer deposition (ALD), high density plasma CVD (HDPCVD), metalorganic CVD (MOCVD), plasma enhanced CVD (PECVD), sputtering, laser ablation, or the like. For example, a chemical vapor deposition process may be used to deposit the cavity filling material 52.

In one embodiment, the cavity filling material 52 may include an epoxy molding compound (EMC). The cavity filling material 52 may include an epoxy-containing compound that may be hardened (i.e., cured) to provide a dielectric material portion having sufficient stiffness and mechanical strength. The cavity filling material 52 may include epoxy resin, hardener, silica (as a filler material), and other additives. The cavity filling material 52 may be provided in a liquid form or in a solid form depending on the viscosity and flowability. Liquid EMC typically provides better handling, good flowability, less voids, better fill, and less flow marks. Solid EMC typically provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be in a range from 125° C. to 150° C.

Excess portions of the cavity filling material 52 may be removed from above the horizontal plane of the topmost surface of the non-organic interposer material layers 421 by performing a planarization process, which may include a chemical mechanical polishing (CMP) process and/or a recess etch process. Remaining portions of the cavity filling material 52 may be subsequently recessed, for example, by performing a wet etch process that recesses top surfaces of the remaining portions of the cavity filling material 52 down to the horizontal plane including the topmost surface of the non-organic interposer material layers 421. In some embodiments, portions of the cavity filling material 52 extending beyond a topmost surface of the non-organic interposer material layers 421 may be reserved, such that portions of the cavity filling material 52 may remain unetched and not on a same horizontal plane of the topmost surface of the non-organic interposer material layers 421.

In some embodiments, the integrated device 50 may be formed within a hybrid interposer cavity 49 that is itself formed within the non-organic interposer structure 420. For example, in one embodiment, the integrated device bumps 436 and the layers of the integrated device 50 may be formed consecutively, and a cavity filling material 52 may be deposited at each layer during each manufacturing step. In another embodiment, the integrated device bumps 436 and the integrated device 50 may be formed consecutively, and a cavity filling material 52 may be deposited to fill in gaps around the integrated device bumps 436 and the integrated device 50. In a further embodiment, a cavity filling material 52 may be deposited and the integrated device bumps 436 and the integrated device 50 may be formed into the cavity filling material 52 (e.g., prior to the cavity filling material 52 hardening). In some embodiments, the integrated device bumps 436 may be formed at the bottom of the hybrid interposer cavity 49, and the integrated device 50 may be subsequently formed over the integrated device bumps 436, such that a bottommost surface of the integrated device bumps 436 are on a same horizontal plane as the bottommost surfaces of the TSV structures 422. In some embodiments, integrated device bumps 436 may be formed on both the top and bottom surfaces of the integrated device 50, such that the integrated device 50 may have top and bottom electrical connections available.

An integrated device 50 may be formed within the hybrid interposer cavity 49 on top of the cavity filling material 52. For example, the integrated device 50 may be formed to be surrounded by the cavity filling material 52 such that the integrated device 50 is not in direct contact with the non-organic interposer material layers 421. The integrated device 50 may be any type of device, such as an active device, such as a voltage regulator, or an integrated passive device (IPD), such as resistors, capacitors, inductors, microstriplines, impedance matching elements, baluns, the like, or any combinations thereof. The integrated device 50 is illustrated generically as a patterned box, but may contain any circuitry, wiring, or materials used to implement the aforementioned example devices. Any suitable manufacturing process to form any type of integrated device 50 may be used. In some embodiments, the integrated device 50 is the IPD, which may be small enough to be integrated in the non-organic interposer structure 420.

Integrated device bumps 436 may be formed over the integrated device 50. The integrated device bumps 436 may be formed at the topmost level of the integrated device 50 to be in electrical connection with wirings or electrical connections (not shown) of the integrated device 50. The integrated device bumps 436 may be formed using a suitable deposition process that includes depositing integrated device bump material on topmost surfaces of the integrated device 50. In one embodiment, integrated device bumps 436 may include copper pads or copper pillars that may be employed as bumps, or microbumps, and may be generally be referred to as integrated device connection structures.

The metallic fill material for the integrated device bumps 436 may include copper, although other suitable metallic conductive materials are within the contemplated scope of disclosure. The thickness of the metallic fill material that is deposited for the integrated device bumps 436 may be in a range from 5 microns to 100 microns, although lesser or greater thicknesses may also be used. The integrated device bumps 436 may have horizontal cross-sectional shapes of rectangles, rounded rectangles, or circles, although other cross-sectional shapes may be used. In embodiments in which the integrated device bumps 436 are formed as C4 (controlled collapse chip connection) pads, the thickness of the integrated device bumps 436 may be in a range from 5 microns to 50 microns, although lesser or greater thicknesses may also be used. Alternatively, the integrated device bumps 436 may be configured for bump bonding (i.e., C2 bonding), and may have a thickness in a range from 30 microns to 100 microns, although lesser or greater thicknesses may also be used. In such an embodiment, the integrated device bumps 436 may be formed as an array of microbumps (such as copper pillars) having a lateral dimension in a range from 10 microns to 25 microns, and having a pitch in a range from 20 microns to 50 microns.

Figure 1E:
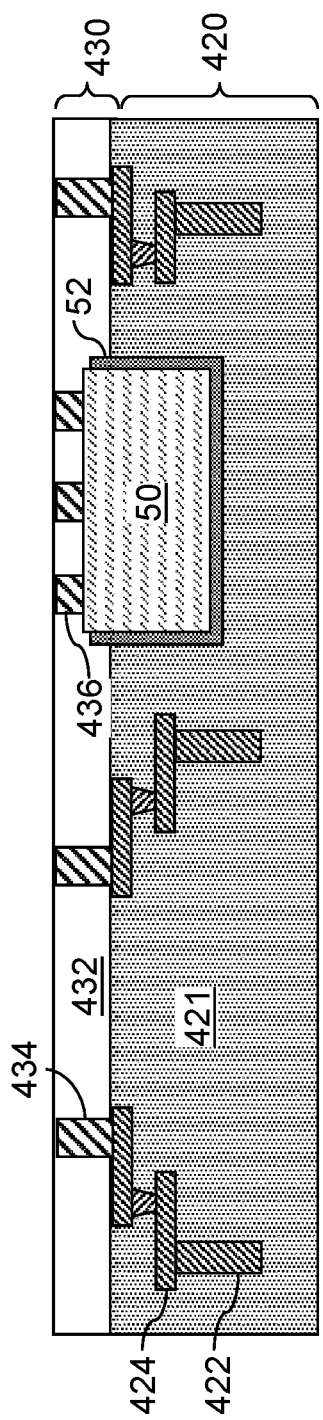
FIG. 1E is a vertical cross-sectional view of a region of the exemplary intermediate structure after depositing a bump filling material according to an embodiment of the present disclosure.

FIG. 1E is a vertical cross-sectional view of a region of an intermediate structure after depositing a bump filling material 432 according to an embodiment of the present disclosure. Referring to FIG. 1E, a bump filling material 432 may be deposited over exposed surfaces of the topmost non-organic interposer material layers 421, the integrated device 50, the cavity filling material 52, the interconnect bumps 434, and the integrated device bumps 436. The bump filling material 432 may be deposited by a suitable deposition process such as CVD, PVD, ALD, HDPCVD, MOCVD, PECVD, sputtering, laser ablation, or the like. For example, a chemical vapor deposition process may be used to deposit the bump filling material 432. In one embodiment, the bump filling material 432 may include an organic material, such as a polymer. For example, the bump filling material 432 may include organic materials, and may be referred to as organic interposer mater layers. Organic materials may include a dielectric polymer material such as polyimide (PI), benzocyclobutene (BCB), or polybenzobisoxazole (PBO). Excess portions of the bump filling material 432 may be removed from above the horizontal plane of the topmost surfaces of the interconnect bumps 434 and the integrated device bumps 436 by performing a planarization process, which may include a chemical mechanical polishing (CMP) process and/or a recess etch process. Remaining portions of the bump filling material 432 may be subsequently recessed, for example, by performing the CMP process or a wet etch process that recesses top surfaces of the remaining portions of the bump filling material 432 down to the horizontal plane including the topmost surfaces of the interconnect bumps 434 and the integrated device bumps 436. In some embodiments in which top surfaces of the interconnect bumps 434 and the integrated device bumps 436 may be at different heights before the CMP process, the said top surfaces may be substantially at the same height by performing the CMP process.

The resulting organic bump structure 430 may include the bump filling material 432, the interconnect bumps 434, the integrated device bumps 436, and a portion of the integrated device 50.

Figure 1F:
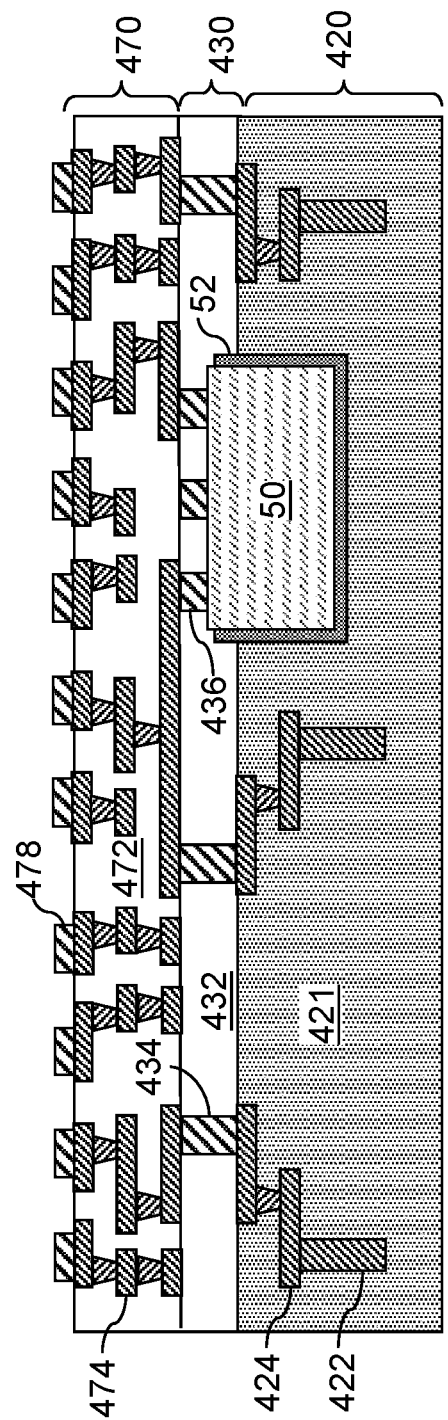
FIG. 1F is a vertical cross-sectional view of a region of the exemplary intermediate structure after forming a die-side redistribution structure according to an embodiment of the present disclosure.

FIG. 1F is a vertical cross-sectional view of a region of an intermediate structure after forming a die-side redistribution structure 470 according to an embodiment of the present disclosure. Referring to FIG. 1F, a die-side redistribution structure 470 may be formed on the organic bump structure 430. Specifically, a die-side redistribution structure 470 may be formed within each die area of the semiconductor assembly including the non-organic interposer structure 420 and the organic bump structure 430. The die-side redistribution structures 470 are redistribution structures that may be formed on the die side, i.e., the side that faces semiconductor dies to be subsequently attached, with respect to the assembly of the non-organic interposer structure 420 and the organic bump structure 430.

Each die-side redistribution structure 470 may include die-side redistribution dielectric layers 472, die-side redistribution wiring interconnects 474, and die-side bonding pads 478. In some embodiments, the die-side redistribution wiring interconnects 474 may be referred to as wiring interconnects for organic interposer. The die-side redistribution dielectric layers 472 may include organic materials. Organic materials may include a dielectric polymer material such as polyimide (PI), benzocyclobutene (BCB), or polybenzobisoxazole (PBO). Each die-side redistribution dielectric layer 472 may be formed by spin coating and drying of the respective dielectric polymer material. The thickness of each die-side redistribution dielectric layer 472 may be in a range from 2 microns to 40 microns, such as from 4 microns to 20 microns. Each die-side redistribution dielectric layer 472 may be patterned, for example, by applying and patterning a respective photoresist layer thereabove, and by transferring the pattern in the photoresist layer into the die-side redistribution dielectric layer 472 using an etch process such as an anisotropic etch process. The photoresist layer may be subsequently removed, for example, by ashing.

Each of the die-side redistribution wiring interconnects 474 and the die-side bonding pads 478 may be formed by depositing a metallic seed layer, by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the die-side redistribution wiring interconnects 474 may include copper, nickel, or copper and nickel. The thickness of the metallic fill material that is deposited for each die-side redistribution wiring interconnect 474 may be in a range from 2 microns to 40 microns, such as from 4 microns to 10 microns, although lesser or greater thicknesses may also be used. The total number of levels of wiring in each die-side redistribution structure 470 (i.e., the levels of the die-side redistribution wiring interconnects 474) may be in a range from 1 to 10, although a greater number of layers may be used. In some embodiments, connections between the die-side redistribution wiring interconnects 474 and the integrated device bumps 436, or connections between the die-side redistribution wiring interconnects 474 and interconnect bumps 434, are formed by other methods, such as Cu to Cu bond by thermal compression bonding (TCB), or Cu pad with Cu plating on it.

The metallic fill material for the die-side bonding pads 478 may include copper, although other suitable metallic conductive materials are within the contemplated scope of disclosure. The thickness of the metallic fill material that is deposited for the die-side bonding pads 478 may be in a range from 5 microns to 100 microns, although lesser or greater thicknesses may also be used. The die-side bonding pads 478 may have horizontal cross-sectional shapes of rectangles, rounded rectangles, or circles, although other cross-sectional shapes are within the contemplated scope of disclosure. In embodiments, in which the die-side bonding pads 478 are formed as C4 (controlled collapse chip connection) pads, the thickness of the die-side bonding pads 478 may be in a range from 5 microns to 50 microns, although lesser or greater thicknesses may also be used. Alternatively, the die-side bonding pads 478 may be configured for microbump bonding (i.e., C2 bonding), and may have a thickness in a range from 30 microns to 100 microns, although lesser or greater thicknesses may also be used. In such an embodiment, the die-side bonding pads 478 may be formed as an array of microbumps (such as copper pillars) having a lateral dimension in a range from 10 microns to 25 microns, and having a pitch in a range from 20 microns to 50 microns.

Figure 1G:
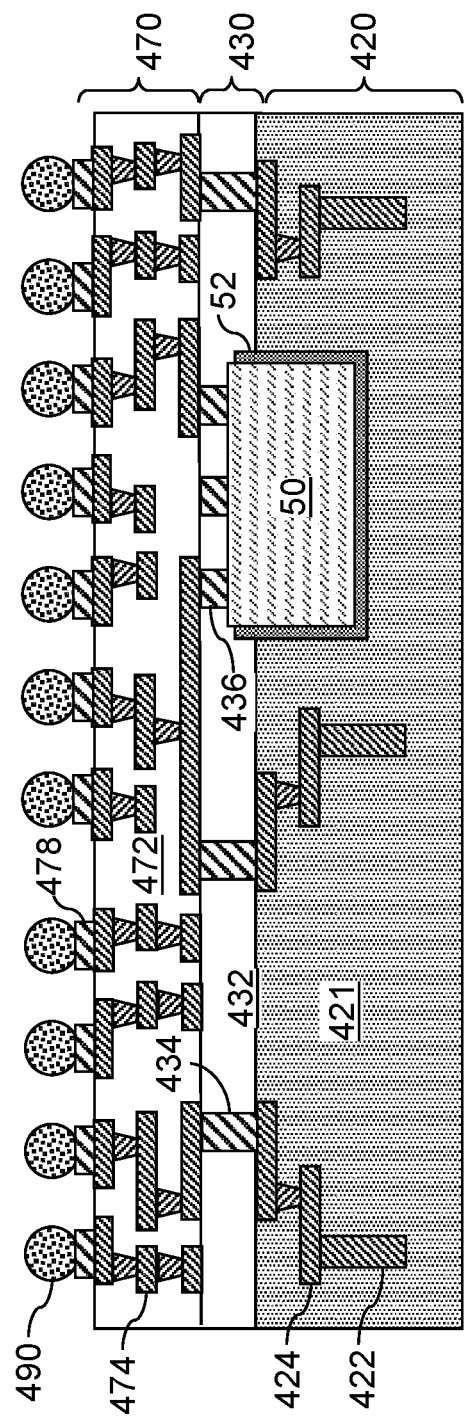
FIG. 1G is a vertical cross-sectional view of a region of the exemplary intermediate structure after attaching solder material portions according to an embodiment of the present disclosure.

FIG. 1G is a vertical cross-sectional view of a region of an intermediate structure after attaching solder material portions 490 according to an embodiment of the present disclosure. Referring to FIG. 1G, solder material portions 490 may be attached to the die-side bonding pads 478. In embodiments in which the die-side bonding pads 478 include C4 bonding pads, the solder material portions 490 may be C4 solder balls, i.e., solder material portions in the shapes of balls that may be used for C4 bonding. In embodiments in which the die-side bonding pads 478 include an array of microbumps for C2 bonding, the solder material portions 490 may be solder caps that wet the entirety of a planar end surface of a respective microbump and have generally hemispherical shapes. In one embodiment, the solder material portions 490 may comprise an array of cylindrical copper pillars each having a horizontal cross-sectional shape of a circle with a diameter in a range from 10 microns to 25 microns. While the present disclosure is described using an embodiment in which the solder material portions 490 are represented by spherical C4 solder balls, embodiments are expressly contemplated herein in which the solder material portions 490 are solder caps having hemispherical shapes.

Figure 1H:
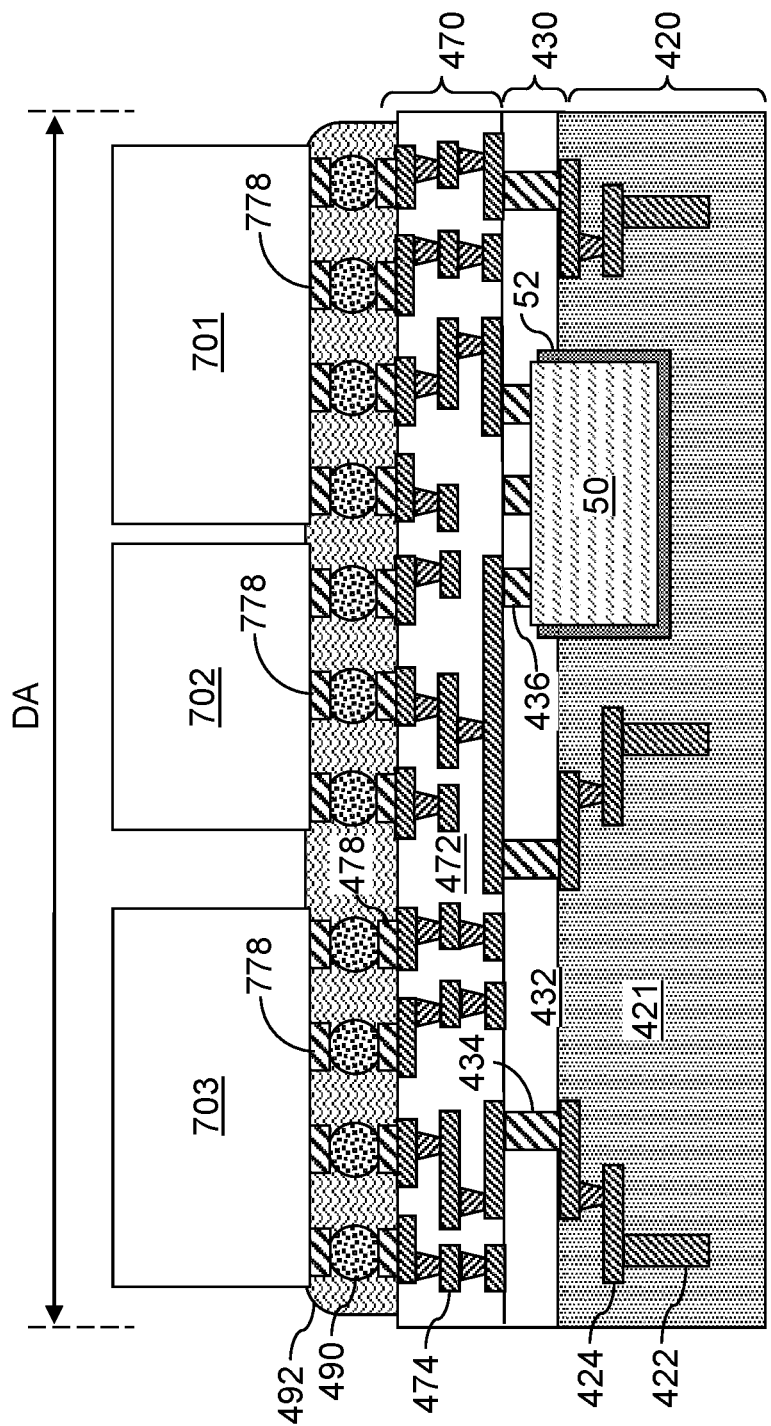
FIG. 1H is a vertical cross-sectional view of a region of the exemplary intermediate structure after attaching at least one semiconductor die to the die-side redistribution structure according to an embodiment of the present disclosure.

FIG. 1H is a vertical cross-sectional view of a region of an intermediate structure after attaching at least one semiconductor die (701, 702, 703) to the die-side redistribution structure 470 according to an embodiment of the present disclosure. Referring to FIG. 1H, at least one semiconductor die (701, 702, 703) may be attached to the die-side redistribution structure 470, which is located within a respective die area DA. Thus, at least one semiconductor die (701, 702, 703) may be electrically connected to a respective integrated device 50 located within a respective die area DA. Each semiconductor die (701, 702, 703) may be bonded to a respective subset of the die-side bonding pads 478 through a respective subset of the solder material portions 490. In one embodiment, at least one semiconductor die (701, 702, 703) may be attached to the die-side redistribution structure 470 through an array of microbumps. In one embodiment, a plurality of semiconductor dies (701, 702, 703) may be attached to the die-side redistribution structure 470 through an array of microbumps or through arrays of microbumps. In such an embodiment, at least one of the semiconductor dies (701, 702, 703) includes an array of microbumps 778 having the same pitch as the die-side bonding pads 478, which include another array of microbumps. A C2 bonding process that reflows the solder material portions 490 may be performed after each array of microbumps 778 of the at least one of the semiconductor dies (701, 702, 703) is disposed over the array of solder material portions 490.

At least one underfill material portion 492 may be formed around each bonded array of solder material portions 490. Each underfill material portion 492 may be formed by injecting an underfill material around the array of solder material portions 490 after the solder material portions 490 are reflowed. Any known underfill material application method may be used, which may be, for example, the capillary underfill method, the molded underfill method, or the printed underfill method. In one embodiment, a plurality of semiconductor dies (701, 702, 703) may be attached to a die-side redistribution structure 470 within each die area DA, and a single underfill material portion 492 may continuously extend underneath the plurality of semiconductor dies (701, 702, 703).

The at least one semiconductor die (701, 702, 703) may include any semiconductor die known in the art. In one embodiment, the at least one semiconductor die (701, 702, 703) may include a system-on-chip (SoC) die such as an application processor die. In one embodiment, the at least one semiconductor die (701, 702, 703) may include a plurality of semiconductor dies (701, 702, 703). In one embodiment, the plurality of semiconductor dies (701, 702, 703) may include a first semiconductor die 701 and at least one second semiconductor die 702. In one embodiment, the first semiconductor die 701 may be a central processing unit die, and the at least one second semiconductor die 702 may include a graphic processing unit die. In another embodiment, the first semiconductor die 701 may include a system-on-chip (SoC) die, and the at least one second semiconductor die 702 may include at least one high bandwidth memory (HBM) die, each of which includes a vertical stack of static random access memory dies and provides high bandwidth as defined under JEDEC standards, i.e., standards defined by The JEDEC Solid State Technology Association. In another embodiment, the first semiconductor die 701 may include a system-on-chip (SoC) die, and the at least one second semiconductor die 702 may include at least one three-dimensional integrated circuit (3DIC) die. The top surfaces of the semiconductor dies (701, 702, 703) that are attached to the die-side redistribution structures 470 may be positioned within a same horizontal plane.

Die-side metal interconnect structures (not shown) may be employed as segments of high-speed inter-die electrically conductive paths between the semiconductor dies (701, 702, 703). Specifically, the combination of the die-side redistribution wiring interconnects 474 and the die-side metal interconnect structures may be employed to enable high-speed signal transmission between the semiconductor dies (701, 702, 703). In one embodiment, the semiconductor dies (701, 702, 703) may include a system-on-chip (SoC) die and at least one high bandwidth memory die, and the combination of the die-side redistribution wiring interconnects 474 and the die-side metal interconnect structures may be employed to provide high speed communication between the system-on-chip die and the at least one high bandwidth memory die. In one embodiment, the semiconductor dies (701, 702, 703) may include a graphic processing unit (GPU) and at least one high bandwidth memory die, and the combination of the die-side redistribution wiring interconnects 474 and the die-side metal interconnect structures may be employed to provide high speed communication between the graphic processing unit and the at least one high bandwidth memory die.

Figure 1I:
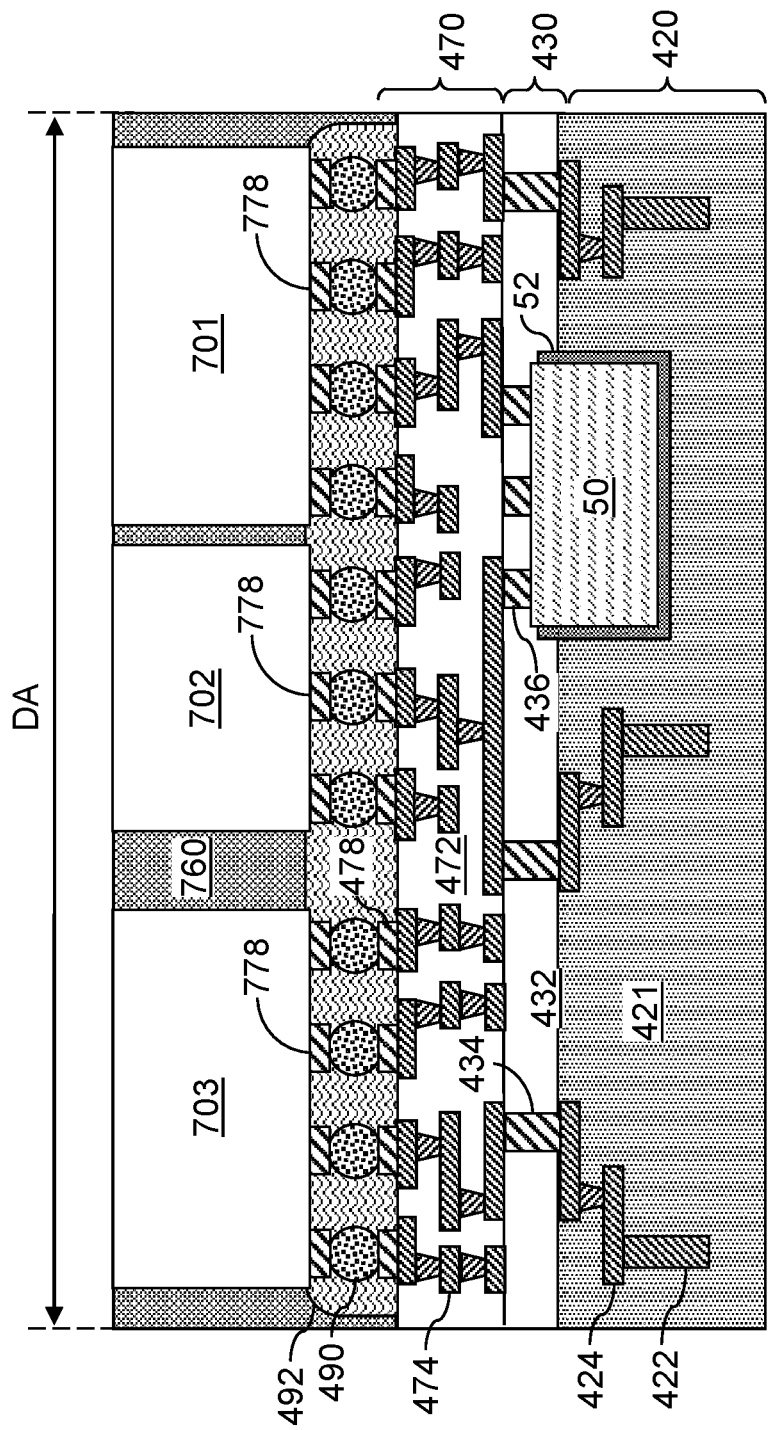
FIG. 1I is a vertical cross-sectional view of a region of the exemplary intermediate structure after depositing an epoxy molding compound according to an embodiment of the present disclosure.

FIG. 1I is a vertical cross-sectional view of a region of an intermediate structure after depositing an epoxy molding compound according to an embodiment of the present disclosure. Referring to FIG. 1I, another encapsulant, such as an epoxy molding compound (EMC), may be applied to the gaps between the semiconductor dies (701, 702, 703). The EMC applied at this processing step may use any of the EMC materials that may be used to form the cavity filling material 52 as described above. The EMC may be cured at a curing temperature to form an EMC matrix that laterally encloses each of the semiconductor dies (701, 702, 703). The EMC matrix includes a plurality of epoxy molding compound (EMC) die frames 760 that may be laterally adjoined to one another. Each EMC die frame 760 may be located within a respective die area DA, and may be formed to laterally surround a respective set of at least one semiconductor die (701, 702, 703) that is bonded to an underlying die-side redistribution structure 470. Excess portions of the EMC may be removed from above the horizontal plane including the top surfaces of the semiconductor dies (701, 702, 703) by a planarization process, which may use chemical mechanical planarization. Generally, each EMC die frame 760 laterally surrounds at least one semiconductor die (701, 702, 703).

Figure 1J:
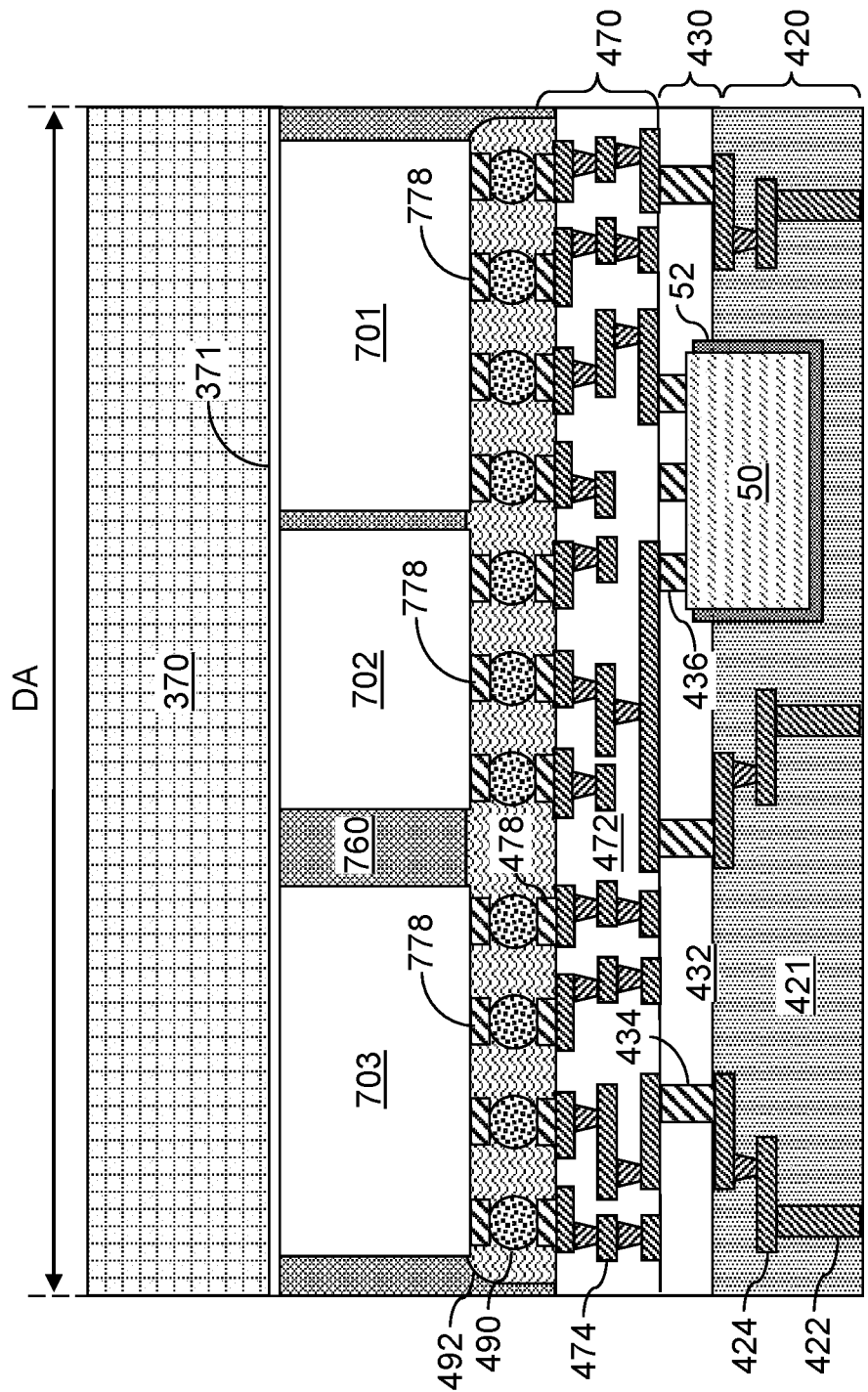
FIG. 1J is a vertical cross-sectional view of a region of the exemplary intermediate structure after removing excess portions of the non-organic interposer material layers and attaching the intermediate structure to a carrier substrate according to an embodiment of the present disclosure.

FIG. 1J is a vertical cross-sectional view of a region of an intermediate structure after removing excess portions of the non-organic interposer material layers 421 according to an embodiment of the present disclosure. Referring to FIG. 1J, a carrier substrate 370 may be attached to the semiconductor dies (701, 702, 703) and the EMC die frames 760. A suitable temporary adhesive layer 371 may be used. The temporary adhesive layer 371 may include a light-to-heat conversion (LTHC) layer in embodiments in which the carrier substrate 370 includes an optically transparent material. Alternatively, the temporary adhesive layer 371 may include a thermally deactivated adhesive material.

Excess portions of the non-organic interposer material layers 421 may be removed from below bottommost portions of the TSV structures 422. A planarization process, which may include a chemical mechanical polishing (CMP) process and/or a recess etch process, may be performed. Remaining portions of the non-organic interposer material layers 421 may be subsequently recessed, for example, by performing a wet etch process that recesses bottommost portions of the non-organic interposer material layers 421 down to the horizontal plane including the bottommost surfaces of the TSV structures 422. Thus, the TSV structures 422 may be exposed to be subsequently electrically connected to additional structures.

Figure 1K:
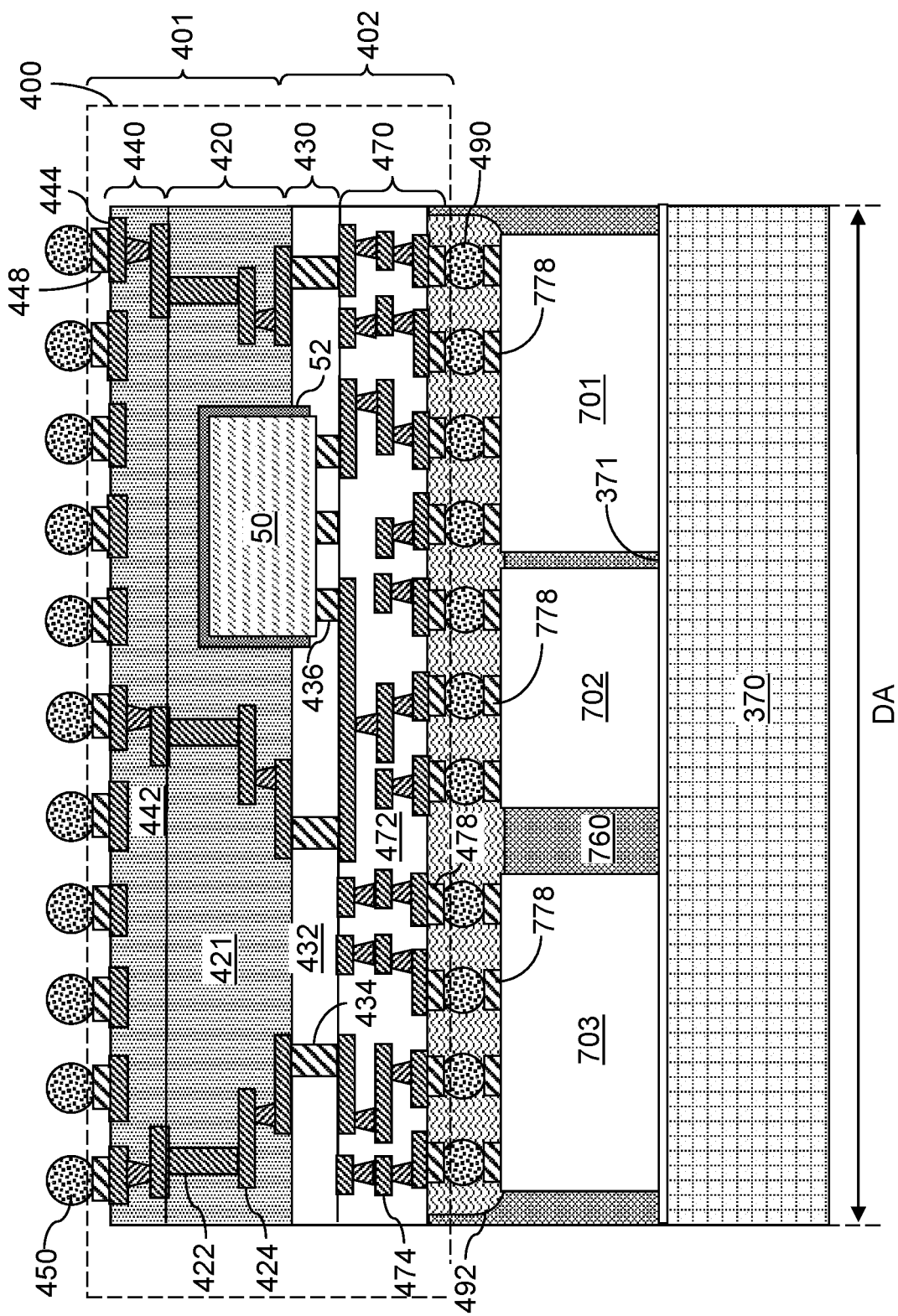
FIG. 1K is a vertical cross-sectional view of a region of the exemplary intermediate structure after forming a package-side redistribution structure according to an embodiment of the present disclosure.

FIG. 1K is a vertical cross-sectional view of a region of an intermediate structure after forming a package-side redistribution structure 440 according to an embodiment of the present disclosure. Referring to FIG. 1K, a package-side redistribution structure 440 may be formed on non-organic interposer structure 420. Specifically, a package-side redistribution structure 440 may be formed within each die area DA of the assembly including the non-organic interposer structure 420. The package-side redistribution structure 440 are redistribution structures that may be formed on the substrate side, i.e., the side that faces a package substrate to be subsequently attached, with respect to the assembly of the non-organic interposer structure 420.

The package-side redistribution structure 440 may include package-side redistribution dielectric layers 442, package-side redistribution wiring interconnects 444, and package-side bonding pads 448. The package-side redistribution dielectric layers 442 may include non-organic materials, (i.e., silicon-based dielectric materials) such as silicon oxide, porous or non-porous organosilicate glass, silicon carbon nitride, silicon nitride, or any other non-organic dielectric material. Each package-side redistribution dielectric layer 442 may be formed by spin coating and drying of the respective non-organic dielectric material. The thickness of each package-side redistribution dielectric layer 442 may be in a range from 2 microns to 40 microns, such as from 4 microns to 20 microns. Each package-side redistribution dielectric layer 442 may be patterned, for example, by applying and patterning a respective photoresist layer thereabove, and by transferring the pattern in the photoresist layer into the package-side redistribution dielectric layer 442 using an etch process such as an anisotropic etch process. The photoresist layer may be subsequently removed, for example, by ashing.

Each of the package-side redistribution wiring interconnects 444 and the package-side bonding pads 448 may be formed by depositing a metallic seed layer, by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the package-side redistribution wiring interconnects 444 may include copper, nickel, or copper and nickel. The thickness of the metallic fill material that is deposited for each package-side redistribution wiring interconnect 444 may be in a range from 2 microns to 40 microns, such as from 4 microns to 10 microns, although lesser or greater thicknesses may also be used. The total number of levels of wiring in the package-side redistribution structure 440 (i.e., the levels of the package-side redistribution wiring interconnects 444) may be in a range from 1 to 10, although a greater number of levels may be used.

The metallic fill material for the package-side bonding pads 448 may include copper, although other conductive metallic fill materials are within the contemplated scope of disclosure. The thickness of the metallic fill material that is deposited for the package-side bonding pads 448 may be in a range from 5 microns to 100 microns, although lesser or greater thicknesses may also be used. The package-side bonding pads 448 may have horizontal cross-sectional shapes of rectangles, rounded rectangles, or circles although other cross-sectional shapes may be used. In embodiments in which the package-side bonding pads 448 may be formed as C4 (controlled collapse chip connection) pads, the thickness of the package-side bonding pads 448 may be in a range from 5 microns to 50 microns, although lesser or greater thicknesses may also be used.

Solder material portions 450 may be attached to the package-side bonding pads 448. In embodiments in which the package-side bonding pads 448 include C4 bonding pads, the solder material portions 450 may be C4 solder balls, i.e., solder material portions in the shapes of balls that may be used for C4 bonding. In embodiments in which the package-side bonding pads 448 include an array of microbumps for C2 bonding, the solder material portions 450 may be solder caps that wet the entirety of a planar end surface of a respective microbump and have generally hemispherical shapes.

Figure 1L:
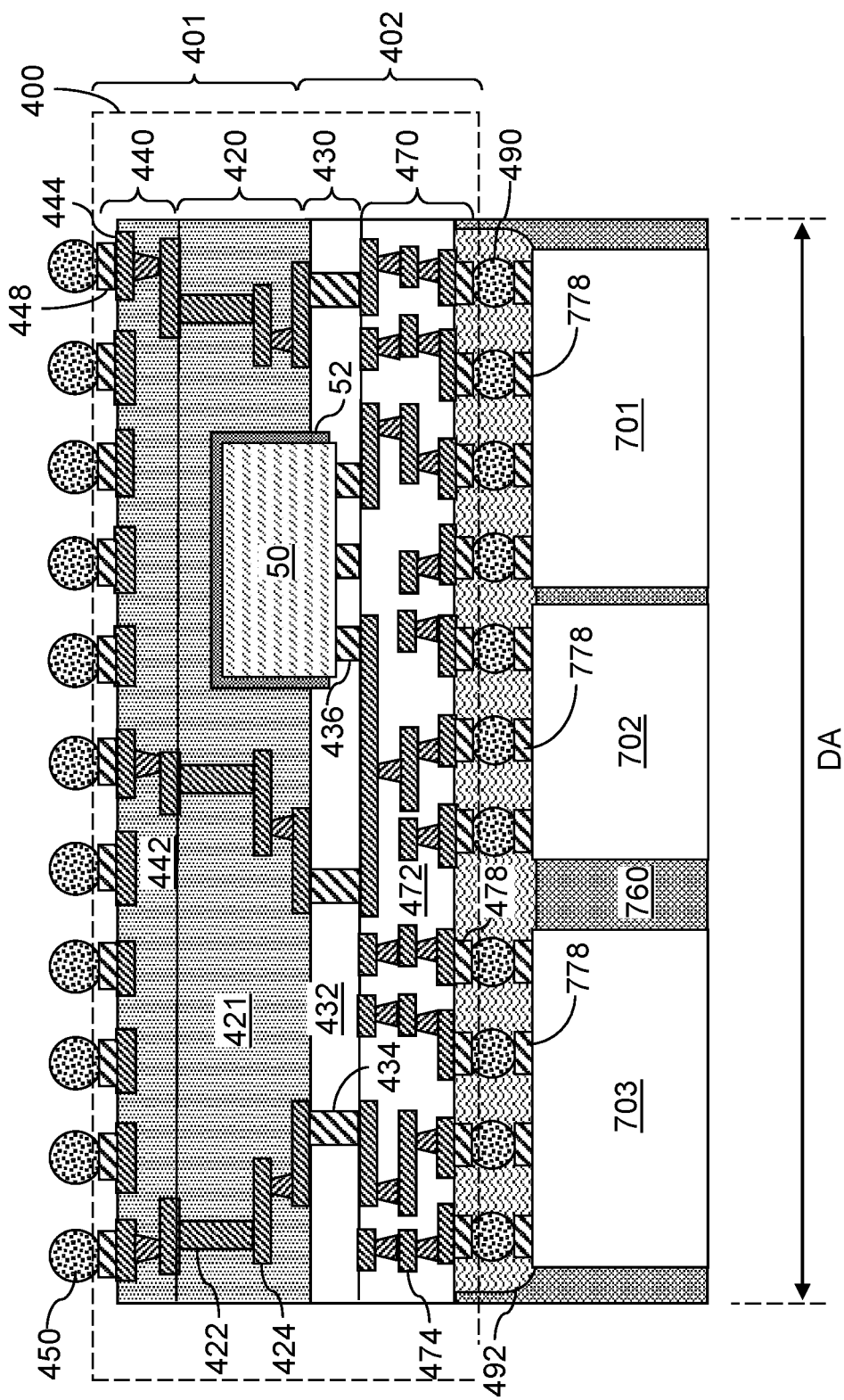
FIG. 1L is a vertical cross-sectional view of a region of the exemplary intermediate structure after detaching the carrier substrate according to an embodiment of the present disclosure.

FIG. 1L is a vertical cross-sectional view of a region of an intermediate structure after detaching the carrier substrate 370 according to an embodiment of the present disclosure. Referring to FIG. 1L, the assembly of the hybrid interposer 400, the two-dimensional array of semiconductor dies (701, 702, 703), and a two-dimensional array of EMC die frames 760 may be detached from the carrier substrate 370. The temporary adhesive layer (not shown) located between the carrier substrate 370 and the two-dimensional array of EMC die frames 760 may be debonded by a suitable method, which may use irradiation of ultraviolet radiation onto the temporary adhesive layer or a thermal anneal.

Figure 1M:
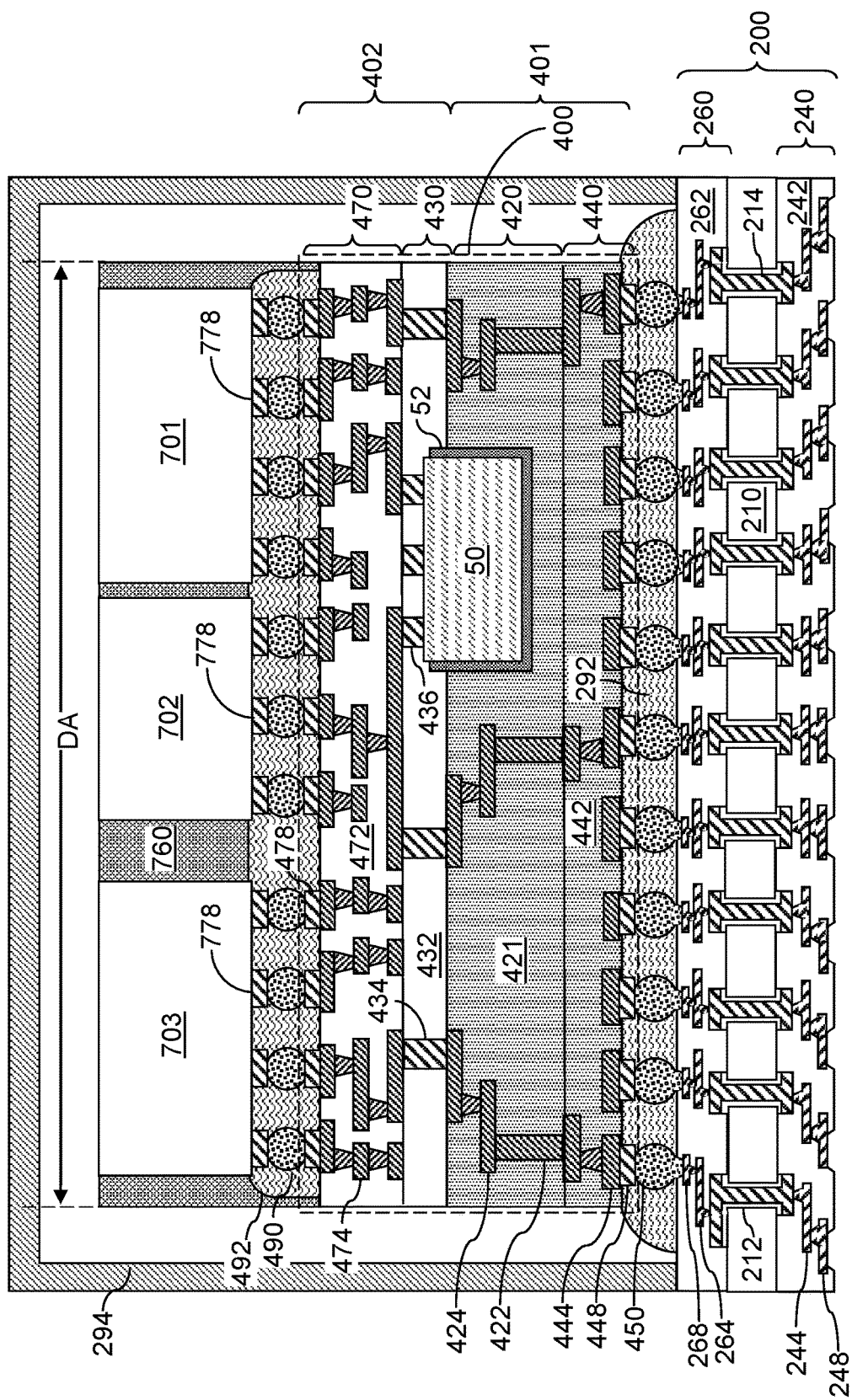
FIG. 1M is a vertical cross-sectional view of a region of the exemplary intermediate structure after forming a package substrate according to an embodiment of the present disclosure.

FIG. 1M is a vertical cross-sectional view of a region of an intermediate structure after forming a package substrate 200 according to an embodiment of the present disclosure. Referring to FIG. 1M, a package substrate 200 may be provided. The package substrate 200 may be a cored package substrate including a core substrate 210, or a coreless package substrate that does not include a package core. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 with board-side wiring interconnects 244 formed therein. The chip-side SLC 260 may include chip-side insulating layers 262 with chip-side wiring interconnects 264 formed therein. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262. An array of board-side bonding pads 248 may be electrically connected to the board-side wiring interconnects 244, and may be configured to allow bonding through solder balls. An array of chip-side bonding pads 268 may be electrically connected to the chip-side wiring interconnects 264, and may be configured to allow bonding through C4 solder balls.

The solder material portions 450 attached to the package-side bonding pads 448 of an assembly of a hybrid interposer 400, at least one semiconductor die (701, 702, 703), and an EMC die frame 760 may be disposed on the array of the chip-side bonding pads 268 of the package substrate 200. A reflow process may be performed to reflow the solder material portions 450, thereby inducing bonding between the fan-out silicon interposer 400 and the package substrate 200. In one embodiment, the solder material portions 450 may include C4 solder balls, and the assembly of the hybrid interposer 400, the at least one semiconductor die (701, 702, 703), and the EMC die frame 760 may be attached to the package substrate 200 using an array of C4 solder balls. An underfill material portion 292 may be formed around the solder material portions 450 by applying and shaping an underfill material. Optionally, a stabilization structure 294, such as a cap structure or a ring structure, may be attached to the assembly of the hybrid interposer 400, the at least one semiconductor die (701, 702, 703), the EMC die frame 760, and the package substrate 200 to reduce deformation of the assembly during subsequent processing steps and/or during usage of the assembly.

Figure 1N:
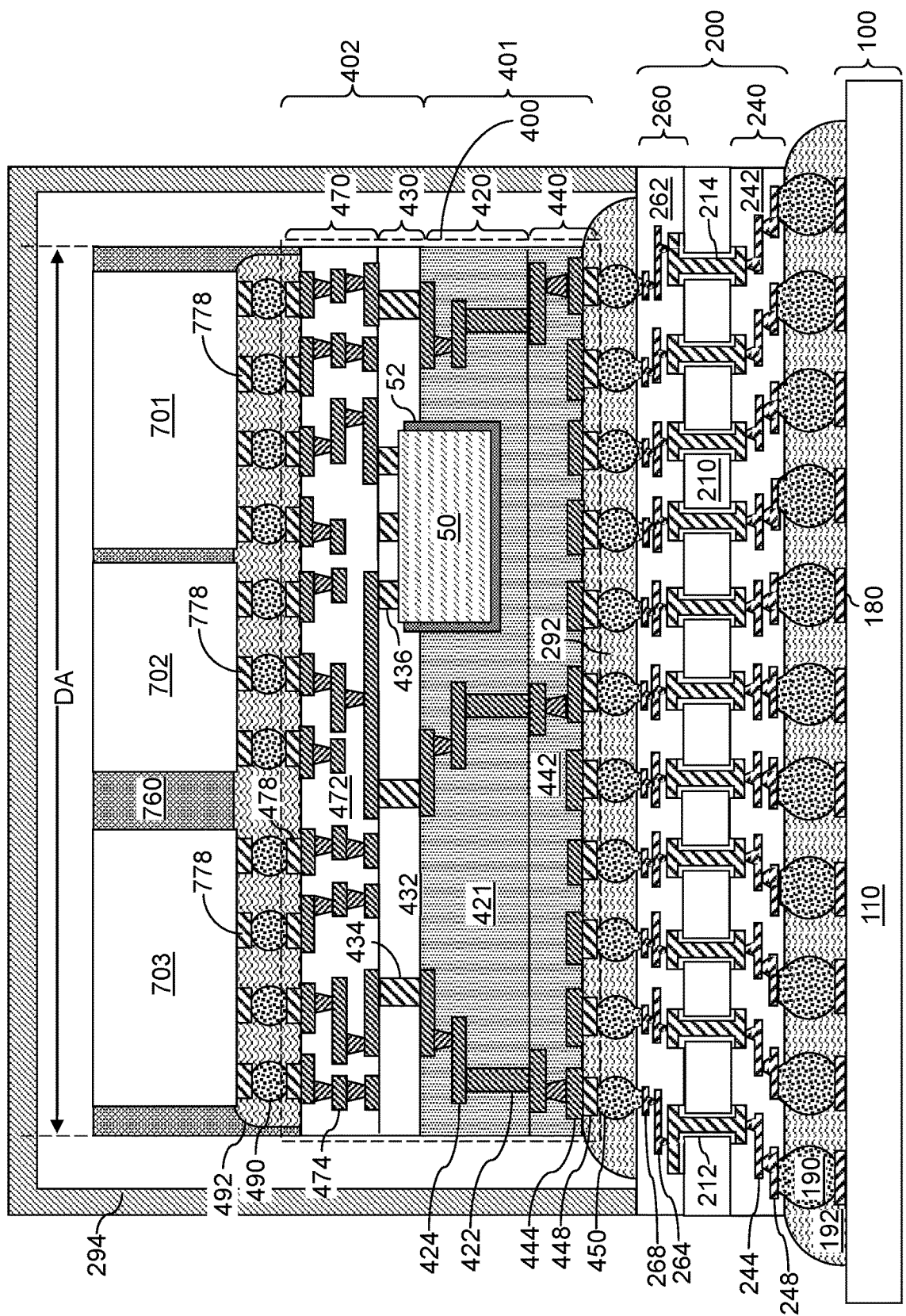
FIG. 1N is a vertical cross-sectional view of a region of the exemplary structure after forming a printed circuit board (PCB) according to an embodiment of the present disclosure.

FIG. 1N is a vertical cross-sectional view of a region of the exemplary structure after forming a printed circuit board (PCB) 100 according to an embodiment of the present disclosure. Referring to FIG. 1N, a PCB 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB 100 through the array of solder joints 190.

A hybrid interposer 400 may be formed from the non-organic interposer structure 420, the package-side redistribution structure 440, the organic bump structure 430, and the die-side redistribution structures 470. The hybrid interposer 400 may include non-organic interposer material layers 401 and organic interposer material layers 402. The non-organic interposer material layers 401 may include the non-organic interposer structure 420 and the package-side redistribution structure 440. The organic interposer material layers 402 may include the organic bump structure 430 and the die-side redistribution structures 470.

The at least one semiconductor die (701, 702, 703) may communicate through wirings within organic interposer material layers 402, then through wirings within the non-organic interposer material layers 401 to the package substrate 200. The organic interposer material layers 402 may have a low Young's modulus, and may act as a stress buffer between the at least one semiconductor die (701, 702, 703) and the non-organic interposer material layers 401 during high-stress thermal manufacturing cycles. The hybrid interposer 400 may therefore withstand high-temperature manufacturing cycles therefore allowing for a wider variety of integrated devices that may be embedded within the hybrid interposer 400.

By implementing the hybrid interposer 400, integrated devices (e.g., integrated device 50) may be safely embedded within the interposer during high-temperature manufacturing processes (i.e., organic interposer material layers 402 have low thermal expansion and contraction). Integrated devices may be formed within a hybrid interposer much closer to semiconductor dies than integrated devices formed within package substrates, thereby reducing the electrical communication pathway, or routing distance, and reducing processing time of the semiconductor device.

Figure 2A:
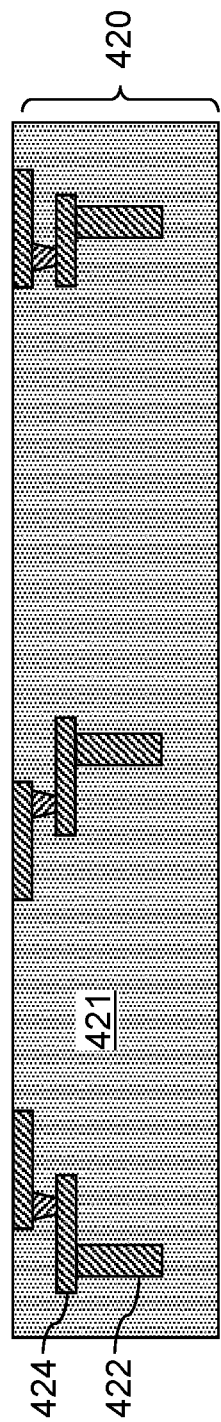
FIG. 2A is a vertical cross-sectional view of a region of an intermediate structure after formation of non-organic interposer structure according to an alternative embodiment of the present disclosure.

FIG. 2A is a vertical cross-sectional view of a region of an intermediate embodiment structure after formation of non-organic interposer structure 420 according to an alternative embodiment of the present disclosure. Referring to FIG. 2A, a non-organic interposer structure 420 may be formed. The non-organic interposer structure 420 may include redistribution structures that may be formed on the substrate side, i.e., the side that faces semiconductor substrate to be subsequently attached. The non-organic interposer structure 420 may include non-organic interposer material layers 421, non-organic interposer wiring interconnects 424, and through-substrate via (TSV) structures 422. The non-organic interposer structure 420 may include a non-organic interposer material layer 421. More than one non-organic interposer material layer 421 may be deposited to form the non-organic interposer structure 420. For example, the non-organic interposer structure 420 may be formed in a series of steps such as by sequentially forming the non-organic interposer wiring interconnects 424 and TSV structures 422 at each of the non-organic interposer material layers 421. The non-organic interposer structure 420 may be formed in a similar manner according to the processing described with reference to FIG. 1A.

Figure 2B:
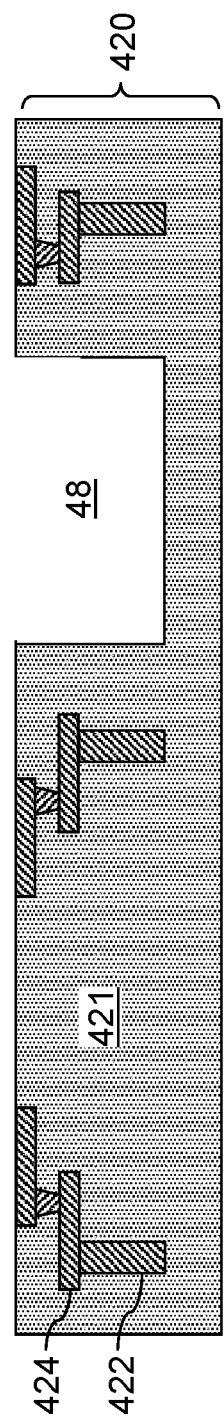
FIG. 2B is a vertical cross-sectional view of a region of an intermediate structure after etching a hybrid interposer cavity according to the alternative embodiment of the present disclosure.

FIG. 2B is a vertical cross-sectional view of a region of an intermediate embodiment structure after etching a hybrid interposer cavity 48 according to an alternative embodiment of the present disclosure. Referring to FIG. 2B, a hybrid interposer cavity 48 may be etched within the non-organic interposer material layers 421 of the non-organic interposer structure 420. A photoresist layer (not shown) may be applied over the top surface of the non-organic interposer material layers 421, and may be lithographically patterned to form the hybrid interposer cavity 48. The pattern of the openings in the photoresist layer may be transferred through the non-organic interposer material layers 421 using an anisotropic etch process that etches the material of the non-organic interposer material layers 421 selective to the material of the interconnect bumps 434 and the non-organic interposer wiring interconnects 424. The photoresist layer may be subsequently removed, for example, by ashing. The dimensions of the hybrid interposer cavity 48 may be selected to be slightly larger than the dimensions of an integrated device to be subsequently embedded within the non-organic interposer structure 420. The hybrid interposer cavity 48 may have a depth within the non-organic interposer structure 420 that is equal to or substantially close to a horizontal plane of the bottommost portions of the TSV structures 422, although smaller depths may be used for various integrated devices (i.e., smaller integrated device dimensions).

Figure 2C:
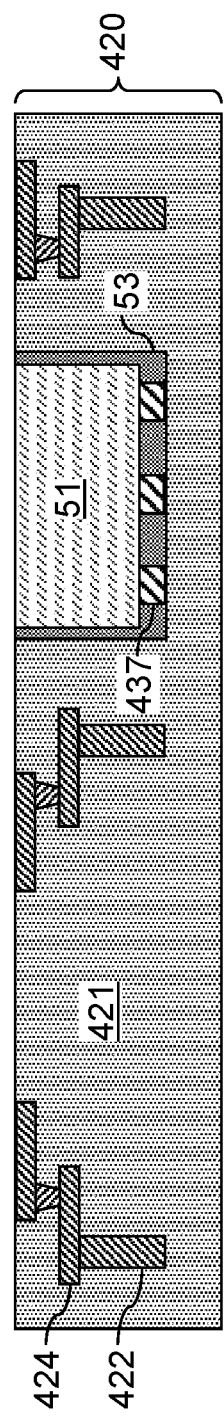
FIG. 2C is a vertical cross-sectional view of a region of an intermediate structure after forming an integrated device according to the alternative embodiment of the present disclosure.

FIG. 2C is a vertical cross-sectional view of a region of an intermediate embodiment structure after forming an integrated device 50 according to an alternative embodiment of the present disclosure. Referring to FIG. 2C, an integrated device 51 may be formed within the non-organic interposer structure 420. A cavity filling material 53 may be deposited in the hybrid interposer cavity 48. The cavity filling material 53 may be deposited in the hybrid interposer cavity 48 by a suitable deposition process such as a chemical vapor deposition (CVD) process. Herein, suitable deposition processes may include CVD, physical vapor deposition (PVD), atomic layer deposition (ALD), high density plasma CVD (HDPCVD), metalorganic CVD (MOCVD), plasma enhanced CVD (PECVD), sputtering, laser ablation, or the like. For example, a chemical vapor deposition process may be used to deposit the cavity filling material 53.

In one embodiment, the cavity filling material 53 may include an epoxy molding compound (EMC). The cavity filling material 53 may include an epoxy-containing compound that may be hardened (i.e., cured) to provide a dielectric material portion having sufficient stiffness and mechanical strength. The cavity filling material 53 may include epoxy resin, hardener, silica (as a filler material), and other additives. The cavity filling material 53 may be provided in a liquid form or in a solid form depending on the viscosity and flowability. Liquid EMC typically provides better handling, good flowability, less voids, better fill, and less flow marks. Solid EMC typically provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be in a range from 125° C. to 150° C.

Excess portions of the cavity filling material 53 may be removed from above the horizontal plane of the topmost surface of the non-organic interposer material layers 421 by performing a planarization process, which may include a chemical mechanical polishing (CMP) process and/or a recess etch process. Remaining portions of the cavity filling material 53 may be subsequently recessed, for example, by performing a wet etch process that recesses top surfaces of the remaining portions of the cavity filling material 53 down to the horizontal plane including the topmost surface of the non-organic interposer material layers 421. In some embodiments, portions of the cavity filling material 53 extending beyond a topmost surface of the non-organic interposer material layers 421 may be reserved, such that portions of the cavity filling material 53 may remain unetched and not on a same horizontal plane of the topmost surface of the non-organic interposer material layers 421.

In contrast to the integrated device bumps 436 described above with respect to FIG. 1C, integrated device bumps 437 in FIG. 2C may be formed at the bottom of the hybrid interposer cavity 48 within the cavity filling material 53. The integrated device bumps 437 may be formed to be in electrical connection with wirings or electrical connections (not shown) of the integrated device 51. The integrated device bumps 437 may be formed using a suitable deposition process that includes depositing integrated device bump material at the bottom of the hybrid interposer cavity 48. In one embodiment, the integrated device bumps 437 may include copper pads or copper pillars that may be employed as bumps, or microbumps, and may be generally be referred to as integrated device connection structures.

In some embodiments, the integrated device 51 may be formed within a hybrid interposer cavity 48 within the non-organic interposer structure 420. For example, in one embodiment, the layers of the integrated device 51 and the integrated device bumps 437 may be formed consecutively, and a cavity filling material 53 may be deposited at each layer during each manufacturing step. In another embodiment, the integrated device 51 and the integrated device bumps 437 may be formed consecutively, and a cavity filling material 53 may be deposited to fill in gaps around the integrated device bumps 437 and the integrated device 51. In a further embodiment, a cavity filling material 53 may be deposited and the integrated device bumps 437 and the integrated device 51 may be formed into the cavity filling material 53 (e.g., prior to the cavity filling material 53 hardening). In some embodiments, the integrated device bumps 437 may be formed at the top of the hybrid interposer cavity 48, and the integrated device 51 may be formed prior to and beneath the integrated device bumps 437, such that a topmost surface of the integrated device bumps 437 are on a same horizontal plane as the topmost surfaces of the non-organic interposer wiring interconnects 424. In some embodiments, integrated device bumps may be formed on both the top and bottom surfaces of the integrated device 51, such that the integrated device 51 may have top and bottom electrical connections available.

The metallic fill material for the integrated device bumps 437 may include copper, although other suitable metallic conductive materials are within the contemplated scope of disclosure. The thickness of the metallic fill material that is deposited for the integrated device bumps 437 may be in a range from 5 microns to 100 microns, although lesser or greater thicknesses may also be used. The integrated device bumps 437 may have horizontal cross-sectional shapes of rectangles, rounded rectangles, or circles, although other cross-sectional shapes may be used. In embodiments in which the integrated device bumps 437 are formed as C4 (controlled collapse chip connection) pads, the thickness of the integrated device bumps 437 may be in a range from 5 microns to 50 microns, although lesser or greater thicknesses may also be used. Alternatively, the integrated device bumps 437 may be configured for bump bonding (i.e., C2 bonding), and may have a thickness in a range from 30 microns to 100 microns, although lesser or greater thicknesses may also be used. In such an embodiment, the integrated device bumps 437 may be formed as an array of microbumps (such as copper pillars) having a lateral dimension in a range from 10 microns to 25 microns, and having a pitch in a range from 20 microns to 50 microns.

An integrated device 51 may be formed within the hybrid interposer cavity 49 on top of the cavity filling material 52 and the integrated device bumps 437. For example, the integrated device 51 may be formed to be surrounded by the cavity filling material 52 such that the integrated device 51 is not in direct contact with the non-organic interposer material layers 421. The integrated device 51 may be any type of device, such as an active device, such as a voltage regulator, or an integrated passive device (IPD), such as resistors, capacitors, inductors, microstriplines, impedance matching elements, baluns, the like, or any combinations thereof. The integrated device 51 is illustrated generically as a patterned box, but may contain any circuitry, wiring, or materials used to implement the aforementioned example devices. Any suitable manufacturing process to form any type of integrated device 51 may be used.

Figure 2D:
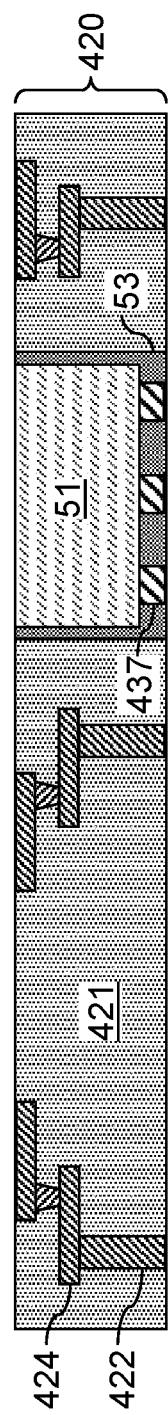
FIG. 2D is a vertical cross-sectional view of a region of an intermediate structure after removing excess portions of the non-organic interposer material layers according to the alternative embodiment of the present disclosure.

FIG. 2D is a vertical cross-sectional view of a region of an intermediate structure after removing excess portions of the non-organic interposer material layers 421 according to an alternative embodiment of the present disclosure. Referring to FIG. 2D, excess portions of the non-organic interposer material layers 421 may be removed from below bottommost portions of the TSV structures 422. A planarization process, which may include a chemical mechanical polishing (CMP) process and/or a recess etch process, may be performed. Remaining portions of the non-organic interposer material layers 421 may be subsequently recessed, for example, by performing a wet etch process that recesses bottommost portions of the non-organic interposer material layers 421 down to the horizontal plane including the bottommost surfaces of the TSV structures 422. Thus, the TSV structures 422 may be exposed to be subsequently electrically connected to additional structures.

Figure 2E:
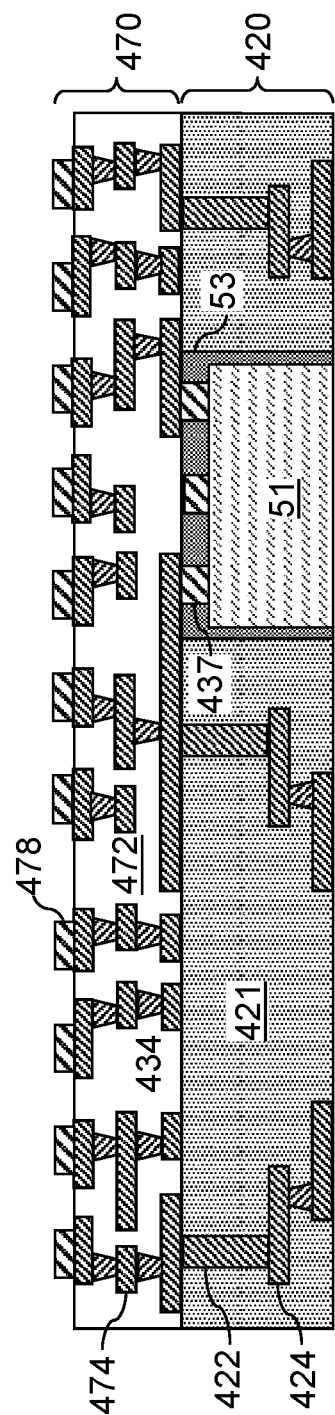
FIG. 2E is a vertical cross-sectional view of a region of an intermediate structure after forming a die-side redistribution structure according to the alternative embodiment of the present disclosure.

FIG. 2E is a vertical cross-sectional view of a region of an intermediate structure after forming a die-side redistribution structure 470 according to an alternative embodiment of the present disclosure. Referring to FIG. 2E, a die-side redistribution structure 470 may be formed on non-organic interposer structure 420. Specifically, a die-side redistribution structure 470 may be formed within each die area of the semiconductor assembly including the non-organic interposer structure 420. The die-side redistribution structures 470 are redistribution structures that may be formed on the die side, i.e., the side that faces semiconductor dies to be subsequently attached, with respect to the assembly of the non-organic interposer structure 420. Each die-side redistribution structure 470 may include die-side redistribution dielectric layers 472, die-side redistribution wiring interconnects 474, and die-side bonding pads 478. The die-side redistribution structure 470 may be formed in a similar manner according to the processing described with reference to FIG. 1F.

Figure 2F:
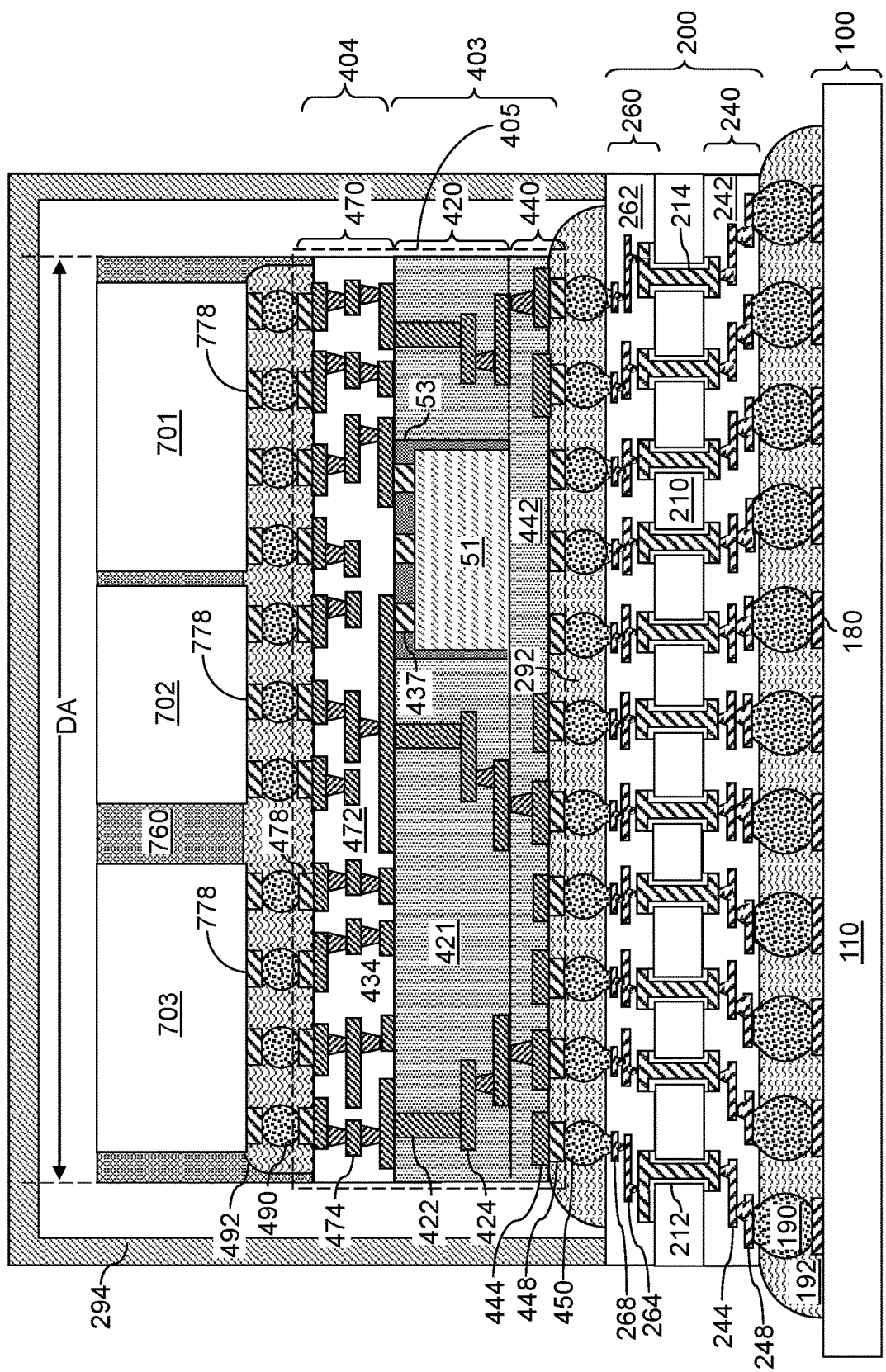
FIG. 2F is a vertical cross-sectional view of a region of an embodiment structure including a hybrid interposer after completion of manufacturing processes according to the alternative embodiment of the present disclosure.

FIG. 2F is a vertical cross-sectional view of a region of an exemplary structure including a hybrid interposer 405 after completion of manufacturing processes according to an alternative embodiment of the present disclosure. Referring to FIG. 2F, the structure in FIG. 2E may be completed in a similar manner according to the processes described with respect to FIGS. 1G-1N.

A hybrid interposer 405 may be formed from the non-organic interposer structure 420, the package-side redistribution structure 440, and the die-side redistribution structures 470. The hybrid interposer 405 may include non-organic interposer material layers 403 and organic interposer material layers 404. The non-organic interposer material layers 403 may include the non-organic interposer structure 420 and the package-side redistribution structure 440. The organic interposer material layers 404 may include the die-side redistribution structures 470.

The at least one semiconductor die (701, 702, 703) may communicate through wirings within organic interposer material layers 404, then through wirings within the non-organic interposer material layers 403 to the package substrate 200. The organic interposer material layers 404 may have a low Young's modulus, and may act as a stress buffer between the at least one semiconductor die (701, 702, 703) and the non-organic interposer material layers 403 during high-stress thermal manufacturing cycles. The hybrid interposer 405 may therefore withstand high-temperature manufacturing cycles therefore allowing for a wider variety of integrated devices that may be embedded within the hybrid interposer 405.

By implementing the hybrid interposer 405, integrated devices (e.g., integrated device 51) may be safely embedded within the interposer during high-temperature manufacturing processes (i.e., organic interposer material layers 404 have low thermal expansion and contraction). Integrated devices may be formed within a hybrid interposer much closer to semiconductor dies than integrated devices formed within package substrates, therefore reducing the electrical communication pathway, or routing distance, and reducing processing time of the semiconductor device.

Figure 3A:
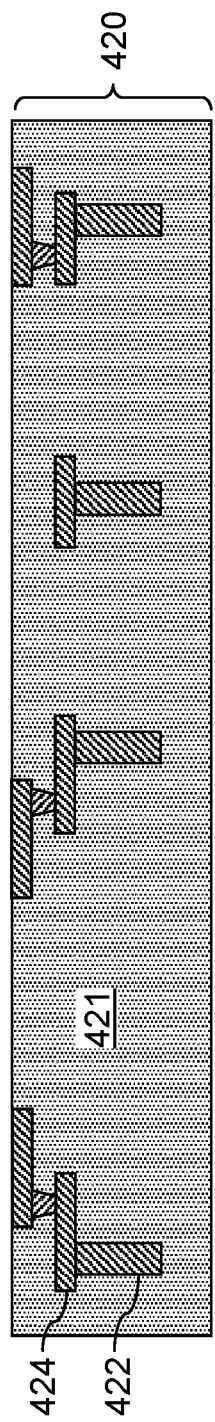
FIG. 3A is a vertical cross-sectional view of a region of an intermediate structure after formation of non-organic interposer structure according to another alternative embodiment of the present disclosure.

FIG. 3A is a vertical cross-sectional view of a region of an intermediate embodiment structure after formation of non-organic interposer structure 420 according to another alternate embodiment of the present disclosure. Referring to FIG. 3A, a non-organic interposer structure 420 may be formed. The non-organic interposer structure 420 may include redistribution structures that may be formed on the substrate side, i.e., the side that faces semiconductor substrate to be subsequently attached. The non-organic interposer structure 420 may include non-organic interposer material layers 421, non-organic interposer wiring interconnects 424, and through-substrate via (TSV) structures 422. The non-organic interposer structure 420 may include a non-organic interposer material layer 421. More than one non-organic interposer material layer 421 may be deposited to form the non-organic interposer structure 420. For example, the non-organic interposer structure 420 may be formed in a series of steps such as by sequentially forming the non-organic interposer wiring interconnects 424 and TSV structures 422 at each of the non-organic interposer material layers 421. The non-organic interposer structure 420 may be formed in a similar manner according to the processing described with reference to FIG. 1A

Figure 3B:
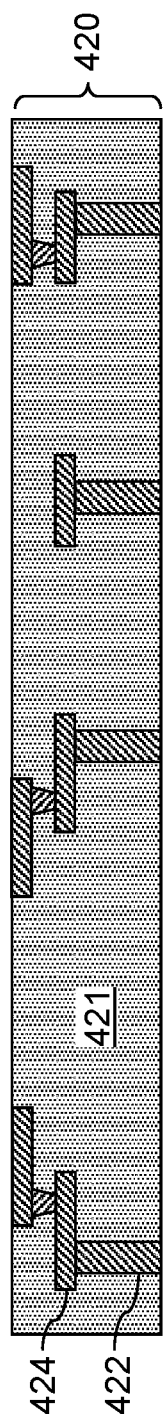
FIG. 3B is a vertical cross-sectional view of a region of an intermediate structure after removing excess portions of the non-organic interposer material layers 421 according to another alternative embodiment of the present disclosure.

FIG. 3B is a vertical cross-sectional view of a region of an intermediate embodiment structure after removing excess portions of the non-organic interposer material layers 421 according to another alternate embodiment of the present disclosure. Referring to FIG. 3B, excess portions of the non-organic interposer material layers 421 may be removed from below bottommost portions of the TSV structures 422. A planarization process, which may include a chemical mechanical polishing (CMP) process and/or a recess etch process, may be performed. Remaining portions of the non-organic interposer material layers 421 may be subsequently recessed, for example, by performing a wet etch process that recesses bottommost portions of the non-organic interposer material layers 421 down to the horizontal plane including the bottommost surfaces of the TSV structures 422. Thus, the TSV structures 422 may be exposed to be subsequently electrically connected to additional structures.

Figure 3C:
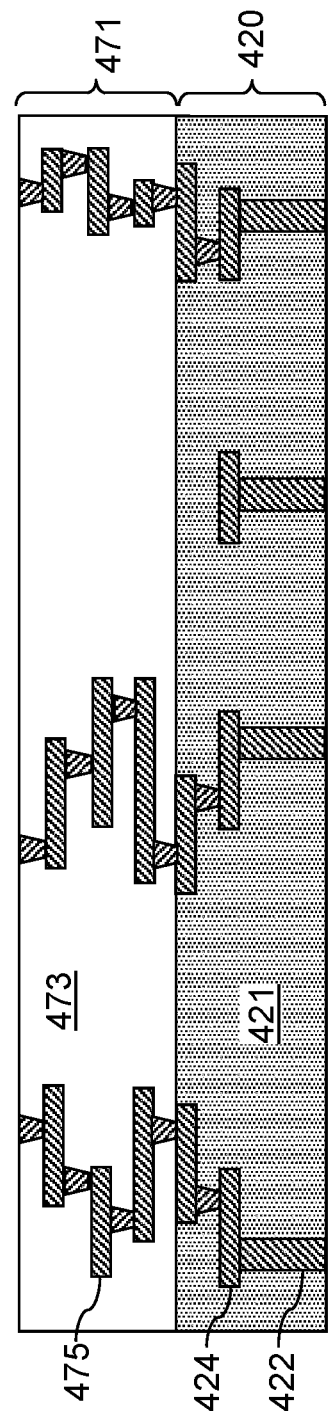
FIG. 3C is a vertical cross-sectional view of a region of an intermediate structure after forming an organic interposer structure according to another alternative embodiment of the present disclosure.

FIG. 3C is a vertical cross-sectional view of a region of an intermediate structure after forming an organic interposer structure 471 according to another alternate embodiment of the present disclosure. Referring to FIG. 3C, an organic interposer structure 471 may be formed on the non-organic interposer structure 420. Specifically, an organic interposer structure 471 may be formed within each die area of the semiconductor assembly including the non-organic interposer structure 420.

The organic interposer structure 471 may include organic interposer material layers 473 and organic interposer wiring interconnects 475. More than one organic interposer material layer 473 may be deposited to form the organic interposer structure 471. The organic interposer material layers 473 may include organic materials. Organic materials may include a dielectric polymer material such as polyimide (PI), benzocyclobutene (BCB), or polybenzobisoxazole (PBO). Each organic interposer material layer 473 may be formed by spin coating and drying of the respective dielectric polymer material. The thickness of each die-side redistribution dielectric layer 472 may be in a range from 2 microns to 40 microns, such as from 4 microns to 20 microns. Each organic interposer material layers 473 may be patterned, for example, by applying and patterning a respective photoresist layer thereabove, and by transferring the pattern in the photoresist layer into the organic interposer material layers 473 using an etch process such as an anisotropic etch process. The photoresist layer may be subsequently removed, for example, by ashing.

Each of the organic interposer wiring interconnects 475 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the organic interposer wiring interconnects 475 may include copper, nickel, or copper and nickel. The thickness of the metallic fill material that is deposited for each organic interposer wiring interconnect 475 may be in a range from 2 microns to 40 microns, such as from 4 microns to 10 microns, although lesser or greater thicknesses may also be used. The total number of levels of wiring in each die-side redistribution structure 470 (i.e., the levels of the organic interposer wiring interconnects 475) may be in a range from 1 to 10 although a greater number of layers may be used.

Figure 3D:
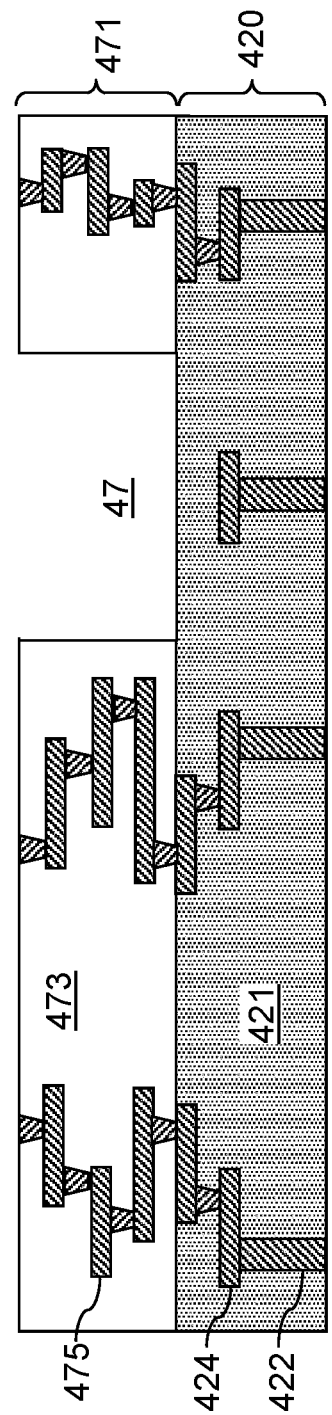
FIG. 3D is a vertical cross-sectional view of a region of an intermediate structure after etching a hybrid interposer cavity according to another alternative embodiment of the present disclosure.

FIG. 3D is a vertical cross-sectional view of a region of an intermediate structure after etching a hybrid interposer cavity 47 according to another alternate embodiment of the present disclosure. Referring to FIG. 3D, a hybrid interposer cavity 47 may be etched within the organic interposer material layers 473 of the organic interposer structure 471. A photoresist layer (not shown) may be applied over the top surface of the organic interposer material layers 473, and may be lithographically patterned to form the hybrid interposer cavity 47. The pattern of the openings in the photoresist layer may be transferred through the organic interposer material layers 473 using an anisotropic etch process that etches the material of the organic interposer material layers 473 selective to the material of the non-organic interposer material layers 421 and the organic interposer wiring interconnects 475. The photoresist layer may be subsequently removed, for example, by ashing. The dimensions of the hybrid interposer cavity 47 may be selected to be slightly larger than the dimensions of an integrated device to be subsequently embedded within the organic interposer structure 471. The hybrid interposer cavity 47 may have a depth within the organic interposer structure 471 that is equal to or relatively equal to a thickness of the organic interposer structure 471. In some embodiments, the cavity 47 may extend into the non-organic interposer structure 420.

Figure 3E:
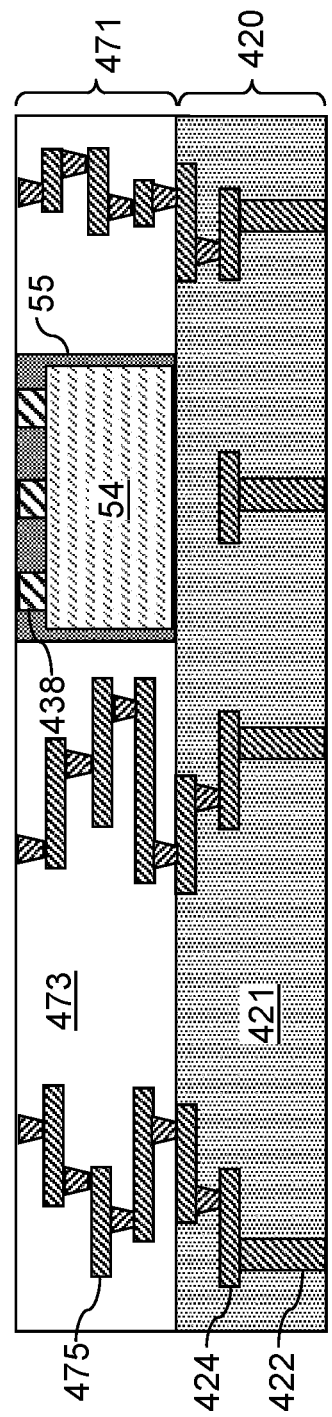
FIG. 3E is a vertical cross-sectional view of a region of an intermediate structure after forming an integrated device according to another alternative embodiment of the present disclosure.

FIG. 3E is a vertical cross-sectional view of a region of the intermediate structure after forming an integrated device 54 according to another alternate embodiment of the present disclosure. Referring to FIG. 3E, an integrated device 54 may be formed within the organic interposer structure 471. A cavity filling material 55 may be deposited in the hybrid interposer cavity 47. The cavity filling material 55 may be deposited in the hybrid interposer cavity 47 by a suitable deposition process such as a chemical vapor deposition (CVD) process. Herein, suitable deposition processes may include CVD, physical vapor deposition (PVD), atomic layer deposition (ALD), high density plasma CVD (HDPCVD), metalorganic CVD (MOCVD), plasma enhanced CVD (PECVD), sputtering, laser ablation, or the like. For example, a chemical vapor deposition process may be used to deposit the cavity filling material 55.

In one embodiment, the cavity filling material 55 may include an epoxy molding compound (EMC). The cavity filling material 55 may include an epoxy-containing compound that may be hardened (i.e., cured) to provide a dielectric material portion having sufficient stiffness and mechanical strength. The cavity filling material 55 may include epoxy resin, hardener, silica (as a filler material), and other additives. The cavity filling material 55 may be provided in a liquid form or in a solid form depending on the viscosity and flowability. Liquid EMC typically provides better handling, good flowability, less voids, better fill, and less flow marks. Solid EMC typically provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flowability. The curing temperature of the EMC may be in a range from 125° C. to 150° C.

Excess portions of the cavity filling material 55 may be removed from above the horizontal plane of the topmost surface of the organic interposer material layers 473 by performing a planarization process, which may include a chemical mechanical polishing (CMP) process and/or a recess etch process. Remaining portions of the cavity filling material 55 may be subsequently recessed, for example, by performing a wet etch process that recesses top surfaces of the remaining portions of the cavity filling material 55 down to the horizontal plane including the topmost surface of the organic interposer material layers 473. In some embodiments, portions of the cavity filling material 55 extending beyond a topmost surface of the organic interposer material layers 473 may be reserved, such that portions of the cavity filling material 55 may remain unetched and not on a same horizontal plane of the topmost surface of the organic interposer material layers 473.

In some embodiments, the integrated device 54 may be formed within the hybrid interposer cavity 47 within the organic interposer structure 471. For example, in one embodiment, the integrated device bumps 438 and the layers of the integrated device 54 may be formed consecutively, and a cavity filling material 55 may be deposited at each layer during each manufacturing step. In another embodiment, the integrated device bumps 438 and the integrated device 54 may be formed consecutively, and a cavity filling material 55 may be deposited to fill in gaps around the integrated device bumps 438 and the integrated device 54. In a further embodiment, a cavity filling material 55 may be deposited and the integrated device bumps 438 and the integrated device 54 may be formed into the cavity filling material 55 (e.g., prior to the cavity filling material 55 hardening). In some embodiments, the integrated device bumps 438 may be formed at the bottom of the hybrid interposer cavity 47, and the integrated device 54 may be subsequently formed over the integrated device bumps 438, such that a bottommost surface of the integrated device bumps 438 are on a same horizontal plane as the bottommost surfaces of the organic interposer wiring interconnects 475 and the organic interposer material layers 473. In some embodiments, integrated device bumps 438 may be formed on both the top and bottom surfaces of the integrated device 54, such that the integrated device 54 may have top and bottom electrical connections available.

An integrated device 54 may be formed within the hybrid interposer cavity 47 on top of the cavity filling material 55. For example, the integrated device 54 may be formed to be surrounded by the cavity filling material 55 such that the integrated device 54 is not in direct contact with the organic interposer material layers 473. The integrated device 54 may be any type of device, such as an active device, such as a voltage regulator, or an integrated passive device (IPD), such as resistors, capacitors, inductors, microstriplines, impedance matching elements, baluns, the like, or any combinations thereof. The integrated device 54 is illustrated generically as a patterned box, but may contain any circuitry, wiring, or materials used to implement the aforementioned example devices. Any suitable manufacturing process to form any type of integrated device 54 may be used.

Integrated device bumps 438 may be formed over the integrated device 54. The integrated device bumps 438 may be formed at the topmost level of the integrated device 54 to be in electrical connection with wirings or electrical connections (not shown) of the integrated device 54. The integrated device bumps 438 may be formed using a suitable deposition process that includes depositing integrated device bump material on topmost surfaces of the integrated device 54. In one embodiment, integrated device bumps 438 may include copper pads or copper pillars that may be employed as bumps, or microbumps, and may be generally be referred to as integrated device connection structures.

The metallic fill material for the integrated device bumps 438 may include copper, although other suitable metallic conductive materials are within the contemplated scope of disclosure. The thickness of the metallic fill material that is deposited for the integrated device bumps 438 may be in a range from 5 microns to 100 microns, although lesser or greater thicknesses may also be used. The integrated device bumps 438 may have horizontal cross-sectional shapes of rectangles, rounded rectangles, or circles, although other cross-sectional shapes may be used. In embodiments in which the integrated device bumps 438 are formed as C4 (controlled collapse chip connection) pads, the thickness of the integrated device bumps 438 may be in a range from 5 microns to 50 microns, although lesser or greater thicknesses may also be used. Alternatively, the integrated device bumps 438 may be configured for bump bonding (i.e., C2 bonding), and may have a thickness in a range from 30 microns to 100 microns, although lesser or greater thicknesses may also be used. In such an embodiment, the integrated device bumps 438 may be formed as an array of microbumps (such as copper pillars) having a lateral dimension in a range from 10 microns to 25 microns, and having a pitch in a range from 20 microns to 50 microns.

Figure 3F:
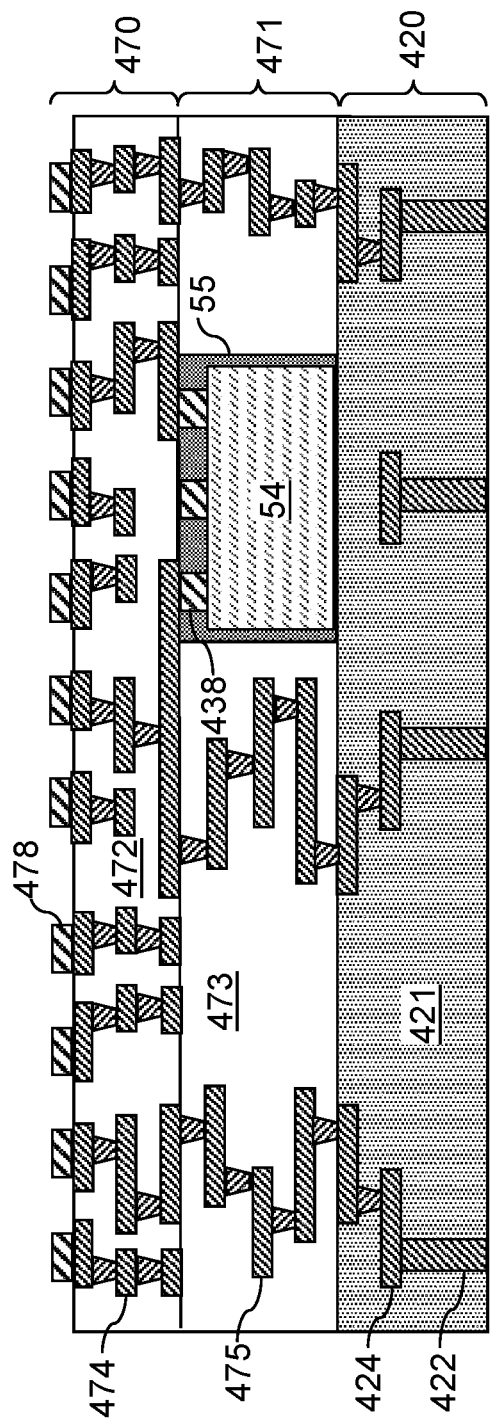
FIG. 3F is a vertical cross-sectional view of a region of an intermediate structure after forming a die-side redistribution structure according to another alternative embodiment of the present disclosure.

FIG. 3F is a vertical cross-sectional view of a region of the intermediate structure after forming a die-side redistribution structure 470 according to another alternate embodiment of the present disclosure. Referring to FIG. 3F, a die-side redistribution structure 470 may be formed on organic interposer structure 471. Specifically, a die-side redistribution structure 470 may be formed within each die area of the semiconductor assembly including the organic interposer structure 471. The die-side redistribution structures 470 are redistribution structures that may be formed on the die side, i.e., the side that faces semiconductor dies to be subsequently attached, with respect to the assembly of the organic interposer structure 471. Each die-side redistribution structure 470 may include die-side redistribution dielectric layers 472, die-side redistribution wiring interconnects 474, and die-side bonding pads 478. The die-side redistribution structure 470 may be formed in a similar manner according to the processing described with reference to FIG. 1F.

Figure 3G:
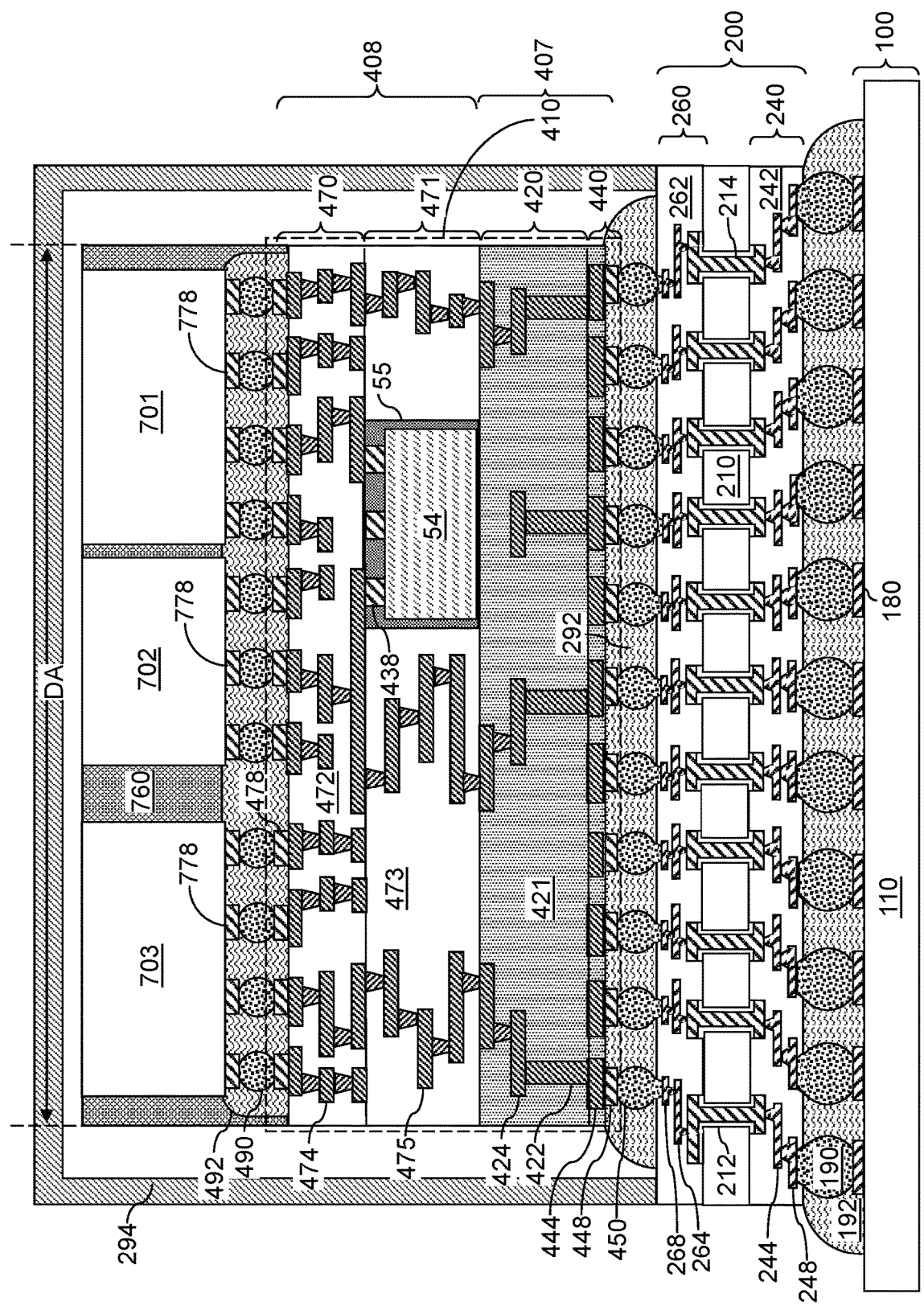
FIG. 3G is a vertical cross-sectional view of a region of an embodiment structure including a hybrid interposer after completion of manufacturing processes according to another alternative embodiment of the present disclosure.

FIG. 3G is a vertical cross-sectional view of a region of an embodiment structure including a hybrid interposer 405 after completion of manufacturing processes according to another alternate embodiment of the present disclosure. Referring to FIG. 3G, the structure in FIG. 3F may be completed in a similar manner according to the processes described with respect to FIGS. 1G-1N.

A hybrid interposer 410 may be formed from the non-organic interposer structure 420, the package-side redistribution structure 440, the die-side redistribution structures 470, and the organic interposer structure 471. The hybrid interposer 410 may include non-organic interposer material layers 407 and organic interposer material layers 408. The non-organic interposer material layers 407 may include the non-organic interposer structure 420 and the package-side redistribution structure 440. The organic interposer material layers 408 may include the die-side redistribution structures 470 and the organic interposer structure 471.

The at least one semiconductor die (701, 702, 703) may communicate through wirings within organic interposer material layers 408, then through wirings within the non-organic interposer material layers 407 to the package substrate 200. The organic interposer material layers 408 may have a low Young's modulus, and may act as a stress buffer between the at least one semiconductor die (701, 702, 703) and the non-organic interposer material layers 407 during high-stress thermal manufacturing cycles. The hybrid interposer 410 may therefore withstand high-temperature manufacturing cycles therefore allowing for a wider variety of integrated devices that may be embedded within the hybrid interposer 410.

By implementing the hybrid interposer 410, integrated devices (e.g., integrated device 54) may be safely embedded within the interposer during high-temperature manufacturing processes (i.e., organic interposer material layers 408 have low thermal expansion and contraction). Integrated devices may be formed within a hybrid interposer much closer to semiconductor dies than integrated devices formed within package substrates, therefore reducing the electrical communication pathway, or routing distance, and reducing processing time of the semiconductor device.

Figure 4:
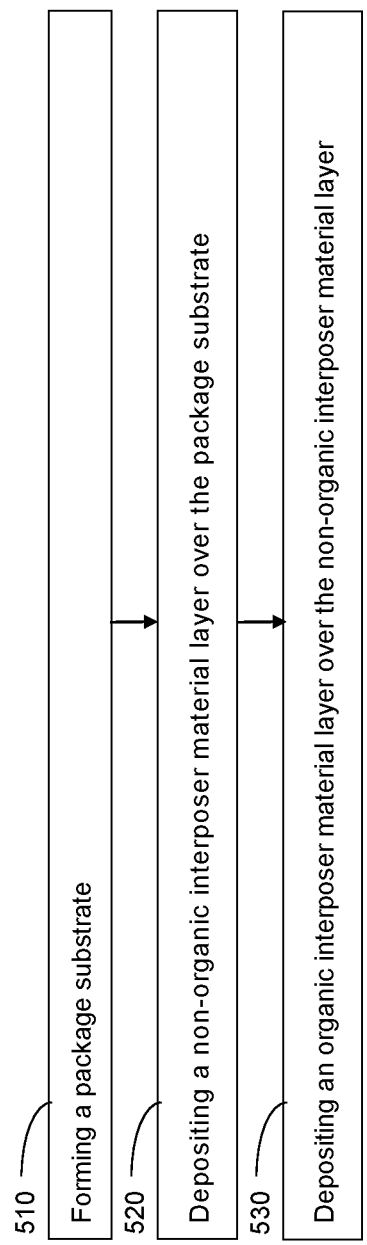
FIG. 4 is a flowchart illustrating steps for forming hybrid interposer structure according to an embodiment of the present disclosure.

FIG. 4 is a flowchart illustrating steps for forming hybrid interposer structure according to an embodiment of the present disclosure. Referring to step 510 and FIG. 4 FIGS. 1M, 2F and 3G, a package substrate 200 may be formed. Referring to step 520 and all drawings, a hybrid interposer (e.g., hybrid interposer 400, 405, 410) may be formed by depositing a non-organic interposer material layer 421 over the package substrate 200. Referring to step 530 and FIGS. 1E, 1F, 2E, and 3C, a hybrid interposer (e.g., hybrid interposer 400, 405, 410) may be formed by depositing an organic interposer material layer (e.g., bump filling material 432, die-side redistribution dielectric layers 472, organic interposer material layers 473) over the non-organic interposer material layer 421.

In one embodiment, referring to FIGS. 1D and 2C, forming the hybrid interposer (e.g., hybrid interposer 400, 405) may further include depositing a layer of an integrated device (e.g., integrated device 50, 51) within the non-organic interposer material layer 421. In one embodiment, referring to FIGS. 1C, 1D, 2B, and 2C, depositing the layer of the integrated device (e.g., integrated device 50, 51) within the non-organic interposer material layer 421 may further include etching a hybrid interposer cavity (e.g., hybrid interposer cavity 48, 49) within the non-organic interposer material layer 421, depositing a cavity filling material (e.g., cavity filling material 52, 53) within the hybrid interposer cavity (e.g., hybrid interposer cavity 48, 49), and depositing the layer of the integrated device (e.g., integrated device 50, 51) within the hybrid interposer cavity.

In one embodiment, referring to FIG. 3E, forming the hybrid interposer 410 may further include depositing a layer of an integrated device 54 within the organic interposer material layer 473. In one embodiment, referring to FIGS. 3D and 3E, depositing the layer of the integrated device 54 within the organic interposer material layer 473 may further include etching a hybrid interposer cavity 47 within the organic interposer material layer 473, depositing a cavity filling material 55 within the hybrid interposer cavity 47, depositing the layer of the integrated device 54 within the hybrid interposer cavity 47.

In one embodiment, referring to FIG. 1D, forming the hybrid interposer hybrid interposer 400 may further include depositing a layer of an integrated device 50 within the non-organic interposer material layer 421. In one embodiment, referring to FIGS. 1C-1E, depositing the layer of the integrated device 50 within the organic interposer material layer (e.g., bump filling material 432, die-side redistribution dielectric layers 472) and the non-organic interposer material layer 421 may further include etching a hybrid interposer cavity 49 within the non-organic interposer material layer 421, depositing a cavity filling material 52 within the hybrid interposer cavity 49, and depositing the layer of the integrated device 50 within the hybrid interposer cavity 49, in which the integrated device 50 may extend beyond a topmost surface of the non-organic interposer material layer 521. In one embodiment, depositing the organic interposer material layer (e.g., bump filling material 432, die-side redistribution dielectric layers 472) over the non-organic interposer material layer 421 may further include depositing the organic interposer material layer (e.g., bump filling material 432, die-side redistribution dielectric layers 472) around sidewalls of the integrated device 50 that extend beyond the topmost surface of the non-organic interposer material layer 421.

In one embodiment, referring to FIGS. 1A-1F, 2A-2E, and 3A-3F, forming a hybrid interposer (e.g., hybrid interposer 400, 405, 410) may further include forming non-organic interposer wiring interconnects 424 within the non-organic interposer material layer 421, and forming organic interposer wiring interconnects (e.g., die-side redistribution wiring interconnects 474, organic interposer wiring interconnects 475) within the organic interposer material layer (e.g., die-side redistribution dielectric layers 472, organic interposer material layers 473). In one embodiment, steps for forming hybrid interposer structure (e.g., hybrid interposer 400, 405, 410) may further include forming a semiconductor die (701, 702, 703) over the organic interposer material layer (e.g., die-side redistribution dielectric layers 472, organic interposer material layers 473), in which the non-organic interposer wiring interconnects 424 and the organic interposer wiring interconnects (e.g., die-side redistribution wiring interconnects 474, organic interposer wiring interconnects 475) electrically connect the integrated device (e.g., integrated device 50, 51, 54) to the semiconductor die (701, 702, 703) and the package substrate (200).

Referring to all drawings and according to various embodiments of the present disclosure, a semiconductor structure is provided. The semiconductor device may include a package substrate 200 and a hybrid interposer (e.g., hybrid interposer 400, 405, 410). The hybrid interposer (e.g., hybrid interposer 400, 405, 410) may include an organic interposer material layer (e.g., bump filling material 432, die-side redistribution dielectric layers 472, organic interposer material layers 473) and a non-organic interposer material layer 421 positioned between the organic interposer material layer (e.g., bump filling material 432, die-side redistribution dielectric layers 472, organic interposer material layers 473) and the package substrate 200. The semiconductor device may further include an integrated device (e.g., integrated device 50, 51, 54) positioned within the hybrid interposer (e.g., hybrid interposer 400, 405, 410).

In one embodiment, the integrated device (e.g., integrated device 50, 54) may be positioned within the organic interposer material layer (e.g., bump filling material 432, die-side redistribution dielectric layers 472, organic interposer material layers 473). In one embodiment, the integrated device 51 may be positioned within the non-organic interposer material layer 421. In one embodiment, the integrated device 50 may be positioned within the organic interposer material layer (e.g., bump filling material 432, die-side redistribution dielectric layers 472, organic interposer material layers 473) and the non-organic interposer material layer 421.

In one embodiment, the organic interposer material layer (e.g., bump filling material 432, die-side redistribution dielectric layers 472, organic interposer material layers 473) may have a Young's modulus value that is less than a Young's modulus value of the non-organic interposer material layer 421.

In one embodiment, the semiconductor device may further include a cavity filling material (e.g., cavity filling material 52, 53, 55) surrounding portions of the integrated device (e.g., integrated device 50, 51, 54), in which the cavity filling material (e.g., cavity filling material 52, 53, 55) is an epoxy molding compound (EMC).

In one embodiment, the integrated device (e.g., integrated device 50, 51, 54) may be an integrated passive device. In one embodiment, the organic interposer material layer (e.g., bump filling material 432, die-side redistribution dielectric layers 472, organic interposer material layers 473) may include a dielectric polymer material. In one embodiment, the non-organic interposer material layer 421 may include a silicon-based dielectric material.

Referring to all drawings and according to various embodiments of the present disclosure, a hybrid interposer (e.g., hybrid interposer 400, 405, 410) is provided. The hybrid interposer (e.g., hybrid interposer 400, 405, 410) may include an organic interposer structure (e.g., organic bump structure 430, die-side redistribution structure 470, organic interposer structure 471) including an organic interposer material layer (e.g., bump filling material 432, die-side redistribution dielectric layers 472, organic interposer material layers 473) and organic interposer wiring interconnects (e.g., die-side redistribution wiring interconnects 474, organic interposer wiring interconnects 475) formed within the organic interposer material layer (e.g., bump filling material 432, die-side redistribution dielectric layers 472, organic interposer material layers 473). The hybrid interposer (e.g., hybrid interposer 400, 405, 410) may further include a non-organic interposer structure 420 including a non-organic interposer material layer 421 positioned between the organic interposer material layer (e.g., bump filling material 432, die-side redistribution dielectric layers 472, organic interposer material layers 473) and the package substrate 200, and non-organic interposer wiring interconnects 424 formed within the non-organic interposer material layer 421.

In one embodiment, the hybrid interposer (e.g., hybrid interposer 400, 405, 410) may further include an integrated device (e.g., integrated device 50, 51, 54) positioned within the organic interposer material layer (e.g., bump filling material 432, die-side redistribution dielectric layers 472, organic interposer material layers 473) and the non-organic interposer material layer 421, and integrated device connection structures (e.g., integrated device bumps 436, 437, 438) electrically connecting with the integrated device, in which the integrated device (e.g., integrated device 50, 51, 54) is electrically connected to the organic interposer wiring interconnects (e.g., die-side redistribution wiring interconnects 474, organic interposer wiring interconnects 475) and the non-organic interposer wiring interconnects 424 through the integrated device connection structures (e.g., integrated device bumps 436, 437, 438).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a package substrate;
   a hybrid interposer comprising at least three interposer material layers, comprising:
      an organic interposer material layer; and
      a non-organic interposer dielectric material layer positioned between the organic interposer material layer and the package substrate;
   organic interposer wiring interconnects formed of metallic materials within the organic interposer material layer;
   non-organic interposer wiring interconnects formed of metallic materials within the non-organic interposer dielectric material layer;
   an integrated device positioned within the hybrid interposer;
   integrated device connection structures electrically connecting with the integrated device, wherein the integrated device is electrically connected to the organic interposer wiring interconnects and the non-organic interposer wiring interconnects through the integrated device connection structures; and
   a cavity filling material in direct contact with a horizontal surface and in direct contact with a vertical surface of the integrated device.

2. The semiconductor device of claim 1, wherein the integrated device is positioned within the organic interposer material layer.

3. The semiconductor device of claim 1, wherein the integrated device is positioned within the non-organic interposer dielectric material layer.

4. The semiconductor device of claim 1, wherein the integrated device is positioned within the organic interposer material layer and the non-organic interposer dielectric material layer.

5. The semiconductor device of claim 1, wherein the organic interposer material layer has a Young's modulus value that is less than a Young's modulus value of the non-organic interposer dielectric material layer.

6. The semiconductor device of claim 1, wherein the cavity filling material surrounding portions of the integrated device, wherein the cavity filling material is an epoxy molding compound (EMC).

7. The semiconductor device of claim 1, wherein the integrated device is an integrated passive device.

8. The semiconductor device of claim 1, wherein the organic interposer material layer includes a dielectric polymer material.

9. The semiconductor device of claim 1, wherein the non-organic interposer dielectric material layer includes a silicon-based dielectric material.

10. A semiconductor device, comprising:
a hybrid interposer comprising at least three interposer material layers, comprising:
an organic interposer material layer on a die side of the hybrid interposer; and
a non-organic interposer dielectric material layer on a package side of the hybrid interposer;
a cavity fill material positioned within the hybrid interposer;
an integrated device positioned within the hybrid interposer and formed within the cavity filling material; and
at least one semiconductor die positioned over the hybrid interposer and electrically connected to the integrated device.

11. The semiconductor device of claim 10, further comprising:
organic interposer wiring interconnects formed of metallic materials within the organic interposer material layer; and
non-organic interposer wiring interconnects formed of metallic materials within the non-organic interposer dielectric material layer.

12. The semiconductor device of claim 11, further comprising:
integrated device connection structures electrically connecting with the integrated device,
wherein the integrated device is electrically connected to the organic interposer wiring interconnects and the non-organic interposer wiring interconnects through the integrated device connection structures.

13. The semiconductor device of claim 11, wherein the organic interposer wiring interconnects further comprise:
a die side redistribution structure formed between the integrated device and the at least one semiconductor die,
wherein the die side redistribution structure electrically connects the integrated device and the at least one semiconductor die.

14. The semiconductor device of claim 11, wherein the non-organic interposer wiring interconnects further comprise:
a package side redistribution structure formed on a side of the non-organic interposer dielectric material layer opposite to the organic interposer material layer,
wherein the package side redistribution structure is electrically connected to the organic interposer wiring interconnects.

15. A semiconductor device, comprising:
a package substrate;
a hybrid interposer comprising at least three interposer material layers, comprising:
an organic interposer material layer; and
a non-organic interposer dielectric material layer;
at least one semiconductor die positioned over and electrically connected to the hybrid interposer; and
an integrated device embedded within the hybrid interposer,
wherein the organic interposer material layer is positioned between the non-organic dielectric material layer and the at least one semiconductor die and the hybrid interposer partially surrounds at least three sides of the integrated device.

16. The semiconductor device of claim 15, wherein the hybrid interposer comprises fan-out electrical connections between the at least one semiconductor die and the package substrate.

17. The semiconductor device of claim 16, wherein the fan-out electrical connections between the at least one semiconductor die and the package substrate further comprise:
die-side redistribution wiring interconnects; and
package-side redistribution wiring interconnects.

18. The semiconductor device of claim 15, further comprising:
an integrated device positioned within the hybrid interposer that wherein the integrated device is electrically connected to the at least one semiconductor die.

19. The semiconductor device of claim 15, further comprising:
organic interposer wiring interconnects formed of metallic materials within the organic interposer material layer; and
non-organic interposer wiring interconnects formed of metallic materials within the non-organic interposer dielectric material layer.

20. The semiconductor device of claim 19, further comprising:
integrated device connection structures electrically connecting with the integrated device,
wherein the integrated device is electrically connected to the organic interposer wiring interconnects and the non-organic interposer wiring interconnects through the integrated device connection structures.

* * * * *